United States Patent [19]

Citron et al.

[11] Patent Number: 4,665,523

[45] Date of Patent: May 12, 1987

[54] METHOD AND MEANS FOR ERROR DETECTION AND CORRECTION IN HIGH SPEED DATA TRANSMISSION CODES

[75] Inventors: Todd K. Citron, Menlo Park; Thomas Kailath, Stanford, both of Calif.

[73] Assignee: Stanford University, Stanford, Calif.

[21] Appl. No.: 580,470

[22] Filed: Feb. 15, 1984

[51] Int. Cl.⁴ ............................................. G06F 11/10
[52] U.S. Cl. ..................................................... 371/37
[58] Field of Search .............................. 371/37, 39, 40

[56] References Cited

PUBLICATIONS

Clark and Cain, Error-Correction Coding for Digital Communications, Plenum Press, New York, 1981, pp. 181–223.

*Primary Examiner*—Charles E. Atkinson
*Attorney, Agent, or Firm*—Flehr, Hohbach, Test, Albritton & Herbert

[57] ABSTRACT

A method and processing matrix for detection and correction of errors in coded data based on determining the error location and error evaluator polynomials using the relationship defined by the key equation. A systolic processor is disclosed which utilizes pipelining and a regular, parallel structure based on a derived algorithm for solving the key equation.

4 Claims, 16 Drawing Figures

DECODING:
• $V(z)$ = RECEIVED WORD = $c(z) + e(z)$

• SYNDROME
$$S_j = V(\alpha^j) = \sum_{i=0} V_i \alpha^{ij}$$

• KEY EQUATION
$$\left(1 + S(z)\right)\Lambda(z) = \omega(z) \bmod z^{2t+1}$$
$$S(z) = S_1 z + \cdots + S_{2t} z^{2t}$$
$$\Lambda(z) = 1 + \Lambda_1 z + \cdots + \Lambda_t$$

DECODING:
- $V(z)$ = RECEIVED WORD = $c(z) + e(z)$

- SYNDROME $$S_j = V(\alpha^j) = \sum_{i=0} V_i \alpha^{ij}$$

- KEY EQUATION $$\left(1 + S(z)\right) \Lambda(z) = \omega(z) \bmod z^{2t+1}$$

$$S(z) = S_1 z + \cdots + S_{2t} z^{2t}$$

$$\Lambda(z) = 1 + \Lambda_1 z + \cdots + \Lambda_t$$

FIG. —1

| INTERACTION: | 0 | | 1 | | 2 | | 3 | | 4 | |
|---|---|---|---|---|---|---|---|---|---|---|
| | 1 | 1 | 1 | 1 | 1 | 1 | 1 | -1 | 1 | 0 |
| | 0 | 1 | 1 | 2 | 1 | 0 | 0 | 0 | 0 | -1 |
| | 0 | 2 | 2 | 2 | 2 | 2 | 2 | -3 | 2 | -2 |
| | 0 | 2 | 2 | 4 | 2 | -1 | -1 | -1 | -1 | -5 |
| | 0 | 4 | 4 | 3 | 4 | 3 | 3 | -8 | ---- | |
| | 0 | 3 | 3 | 6 | 3 | -5 | ---- | | 0 | 1 |
| | 0 | 6 | 6 | 1 | ---- | | 0 | 1 | 0 | 0 |
| | 0 | 1 | ---- | | 0 | 1 | 1 | -1 | 1 | -2 |
| | ---- | | 0 | 1 | 0 | -1 | -1 | -1 | -1 | 0 |
| | 0 | 1 | 1 | 0 | 1 | 0 | 0 | 0 | 0 | 0 |
| N | 1 | | 0 | | 1 | | 0 | | 1 | |
| $\overline{N}$ | -1 | | 0 | | -1 | | 0 | | 1 | |
| $\gamma$ | 1 | | 0 | | 1 | | 0 | | 0 | |
| -P | -1 | | -1 | | -1 | | 1 | | 0 | |

| INTERACTION: | 5 | | 6 | | 7 | | 8 | | |
|---|---|---|---|---|---|---|---|---|---|
| | 1 | -1 | -1 | -2 | -1 | 1 | ---- | | |
| | 0 | -2 | -2 | -3 | ---- | | 0 | 1 | |
| | 2 | -5 | ---- | | 0 | 1 | 0 | -2 | |
| | ---- | | 0 | 1 | 0 | -2 | 0 | -1 | SOLUTION VECTOR [1 -2 -1 -5 -3] |
| | 0 | 1 | 1 | 0 | 1 | -2 | 1 | 5 | |
| | 0 | 0 | 0 | -2 | 0 | 5 | 0 | -3 | |
| | 0 | -2 | -2 | 1 | -2 | -1 | -2 | 0 | |
| | 1 | 0 | 0 | -1 | 0 | 0 | 0 | 0 | |
| | -1 | 0 | 0 | 0 | 0 | 0 | 0 | 0 | |
| | 0 | 0 | 0 | 0 | 0 | 0 | 0 | 0 | |
| | 2 | | -1 | | 0 | | | | |
| | -2 | | -1 | | 0 | | | | |
| | 1 | | 0 | | 0 | | | | |
| | 1 | | -2 | | 1 | | | | |

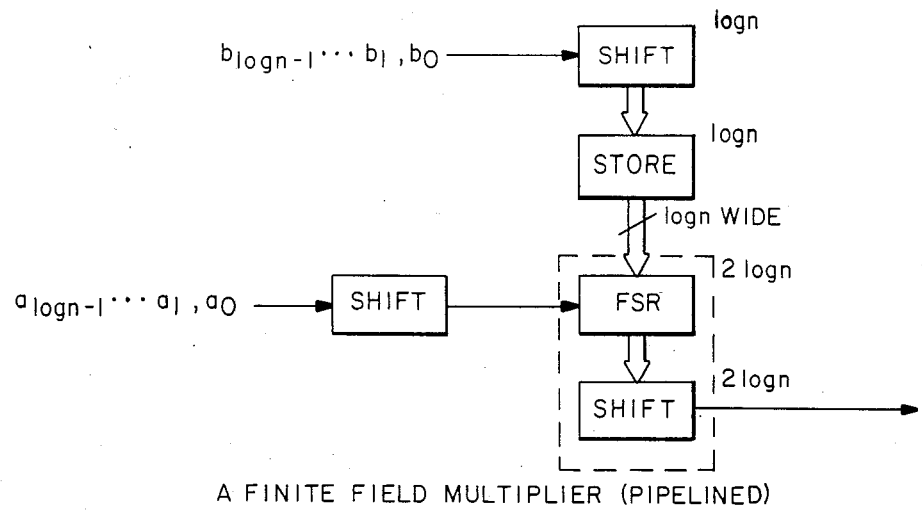
A FINITE FIELD MULTIPLIER (PIPELINED)
FIG.—3A
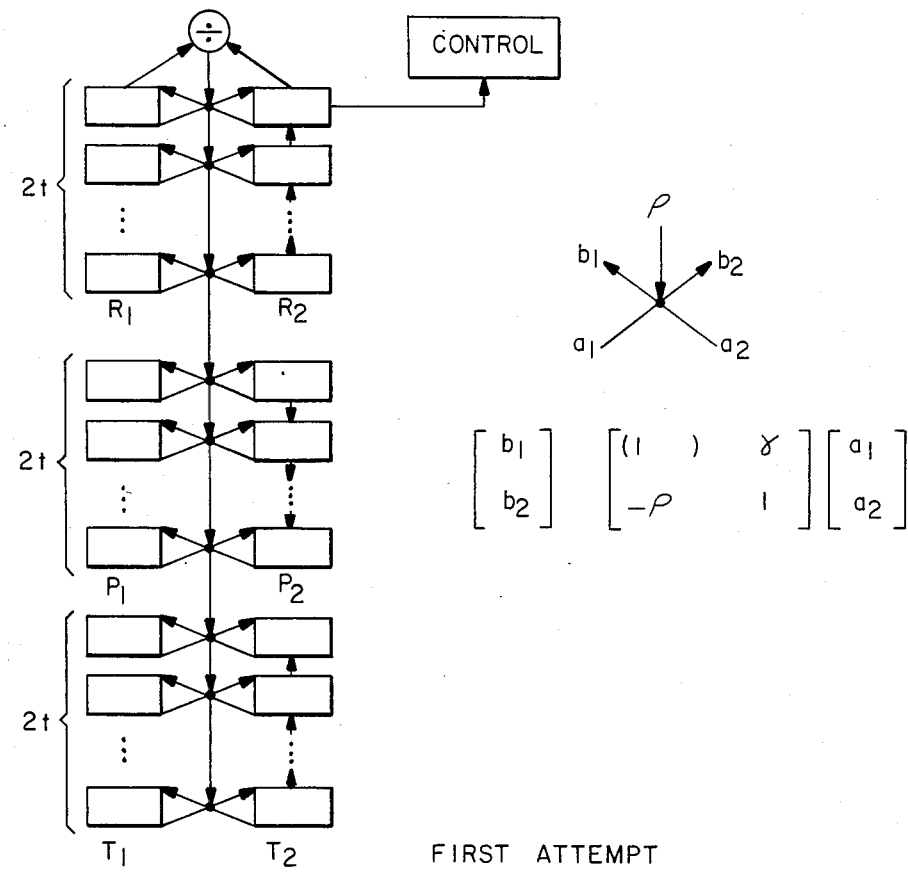
FIRST ATTEMPT
FIG.—3B

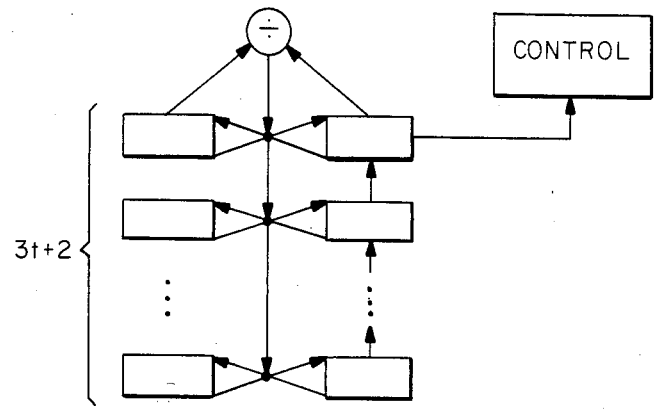
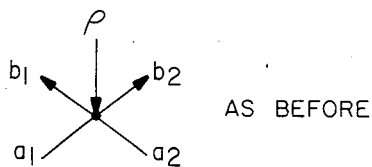
AS BEFORE
STORAGE REDUCTION
FIG. − 4
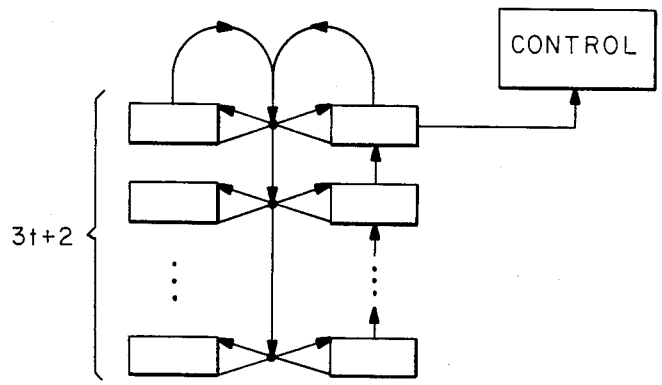
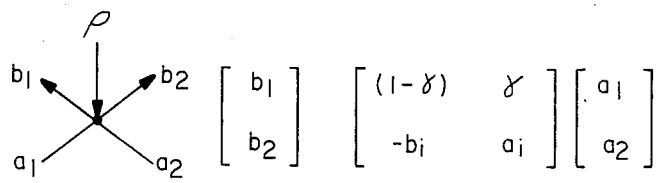
ELIMINATION OF DIVISION
FIG. − 5

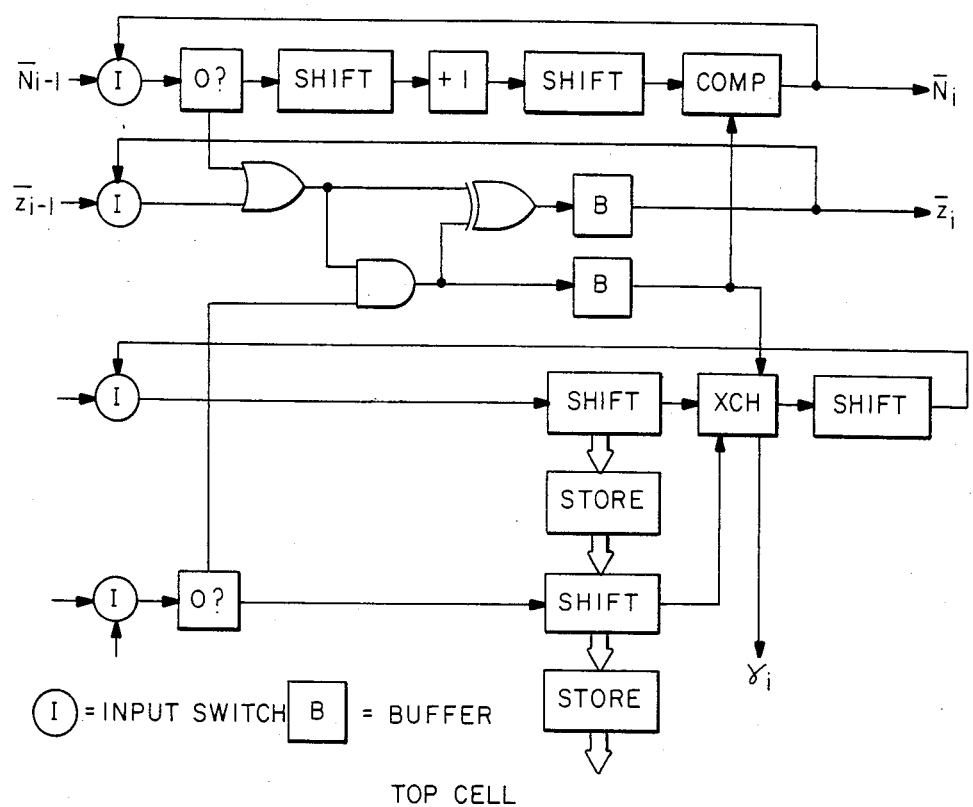
TOP CELL
FIG.—6
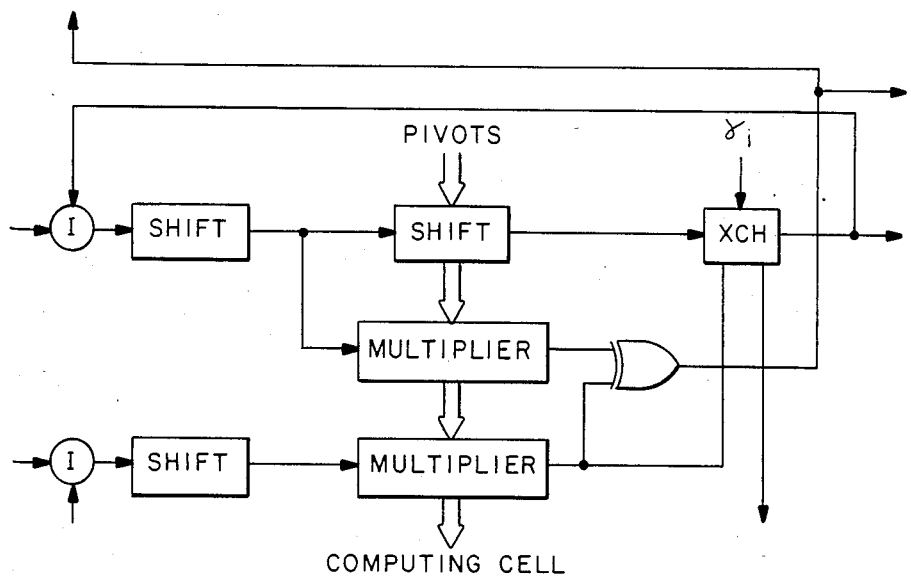
COMPUTING CELL
FIG.—7

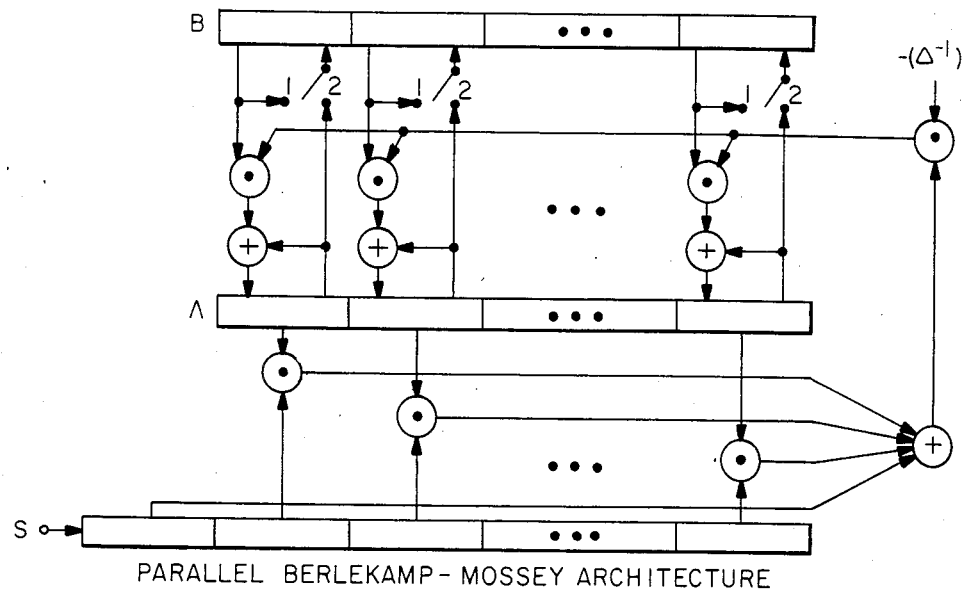
PARALLEL BERLEKAMP-MASSEY ARCHITECTURE
FIG. —8
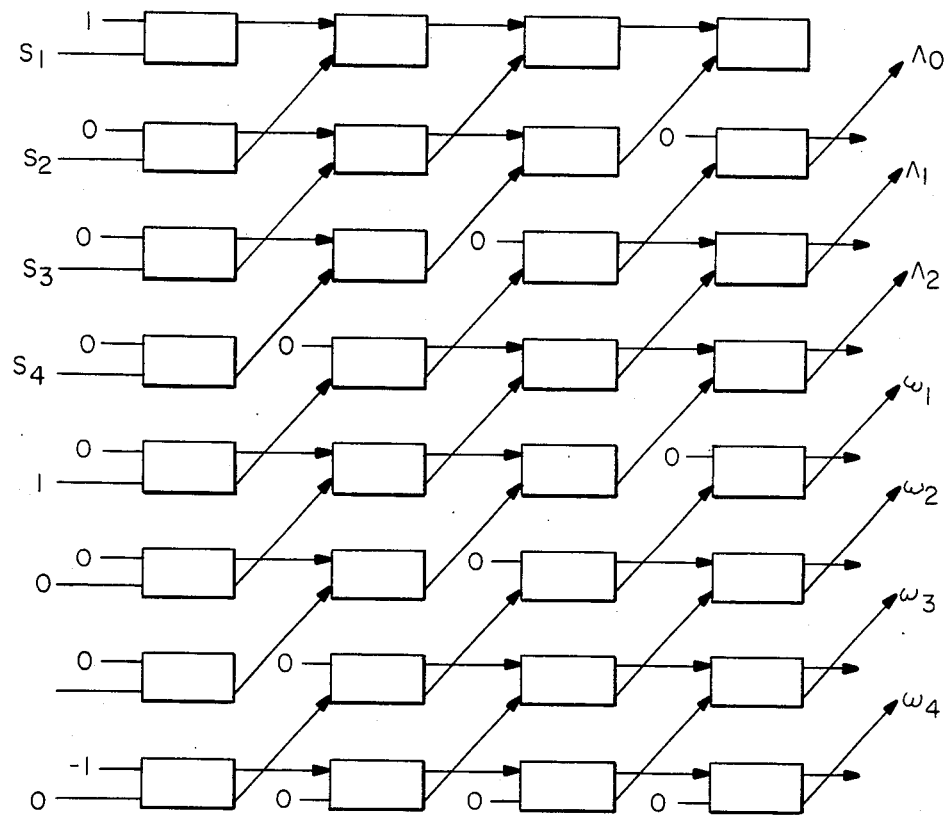
PIPELINE ARRAY - t = 2
FIG. — 9

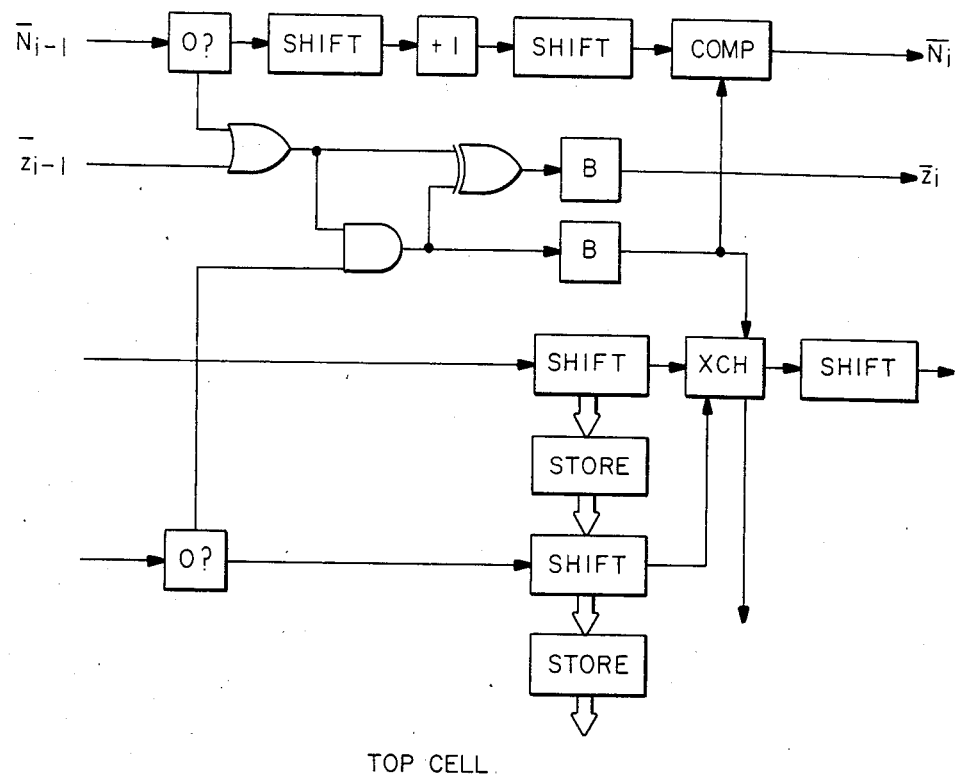
TOP CELL
FIG.—10a
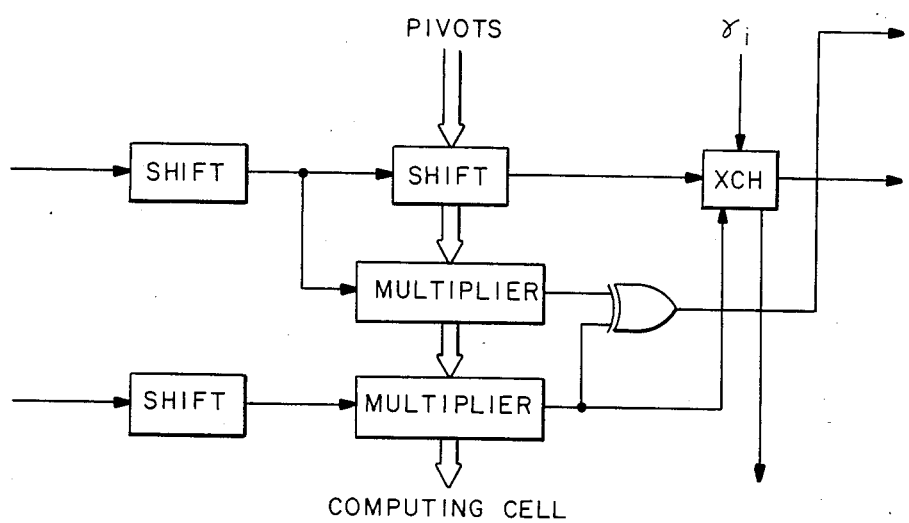
COMPUTING CELL
FIG.—10b

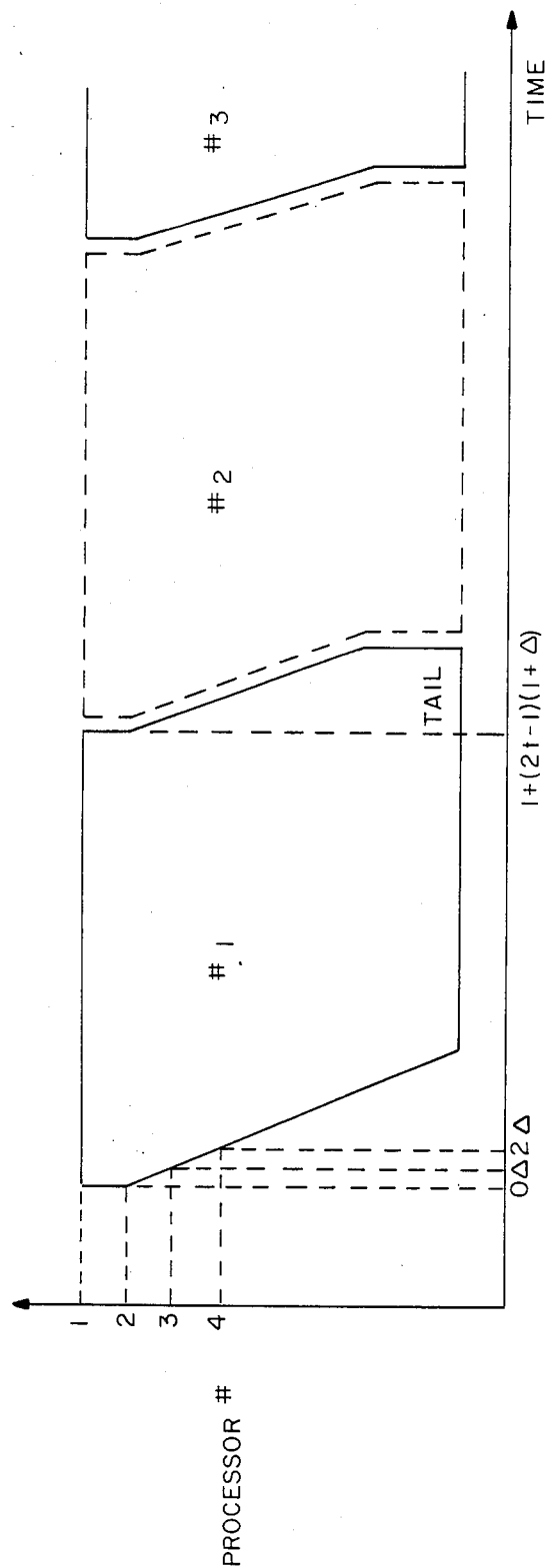
FIG.—11

METHOD AND MEANS FOR ERROR DETECTION AND CORRECTION IN HIGH SPEED DATA TRANSMISSION CODES

The U.S. Government has rights in the claimed invention pursuant to Department of Army Contract No. DAAG 29-83-K-0028.

This invention relates generally to error detection and correction in coded data, and more particularly the invention relates to a method and apparatus for use with high speed coded data.

The use of satellite communication links has led to data transmission at increased data rates. As the rate of data transmission increases the need for more powerful and complex data codes increases. However, a limitation on the use of powerful codes at high data rates is the present inability to identify and correct data errors in a timely manner. Thus, specialized codes are now employed which permit correction of only a few errors.

BCH and Goppa are known codes which can be decomposed for error identification and correction. The decoding procedure includes computation of syndromes from received data words, computation of error locator and error evaluator polynomials from the syndromes, computation of error location and magnitude from the polynomials, and then correction of the errors in the data. The relationship defining the error-locator and evaluator polynomials from the syndromes is known as the key equation. Berlekemp, *Algebraic Coding Theory*, McGraw Hill, New York 1968 discloses the first known procedure for solving the key equation. Berlekemp presents a parallel architecture for implementing the solution, however, because of an inner product operation the architecture does not possess the regularity necessary for rapid implementation.

Massey, "Shift Register Synthesis and BCH Decoding", IEEE Transactions of Information Theory, Vol. IT-15, 1969, pgs. 122-127 gives a new interpretation of Berlekemp's algorithm and also presents a parallel architecture.

Sugiyama et al, "A Method of Solving Key Equation for Decoding Goppa Codes", Information and Control, 27, 1975, pgs. 87-99 shows that Euclid's algorithm for computing the greatest common deviser of two polynomials can be used to solve the key equations. However, no architecture for implementing the computation is given.

Kung, "Multivariable and Multidimensional Systems: Analysis and Design", "PhD Dissertation, Stanford University," 1977 presents a derivation of what is known as the generalized Lanczos algorithm which can be used to solve the key equation. However, the algorithm requires matrix inversions which are difficult to implement in hardware.

The present invention provides a method and processing system which facilitates the rapid error identification and correction of high speed coded data by using parallel, pipeline operation in determining the error-locator and error evaluator polynomials from the syndromes. The regular and highly parallel architecture for performing the second part of the coding procedure results from reformulating the usual algorithm for solving the key equations. The method is faster by a factor of at least log 2t (t being the number of errors the code can correct) than the procedure presented by Berlekemp and Massey. Unlike Kung, the architecture for implementing the method eliminates matrix inversion and provides a much more regular set of recursions, thus resulting in a faster solution and simpler hardware layout.

In accordance with one feature of the invention, parallel structure of the architecture permits the performance of multiplications concurrently, thereby increasing processing speed. While some prior art solutions to the key equation can be made in parallel, these methods require an inner product operation.

In accordance with another feature of the invention, the architecture for implementing the method is pipelineable thereby allowing operation on a new problem while the solution to an old problem is still being completed. The pipeline structure allows several iterations of the same problem to be performed concurrently while also allowing several problems to be processed at the same time. This multiple pipelining increases the rate at which new syndromes can be accepted for processing.

In accordance with yet another feature of the invention the number of iterations required to solve the key equation is a function of the actual number of errors that occur rather than the maximum number of errors that can be corrected. Thus, the architecture can be designed for the average number of errors that occur instead of the worst case, thereby resulting in hardware savings.

Still another feature of the invention is the regular architecture (i.e. a systolic array) in which only local connections between processing elements are required. This property is important when considering an integrated circuit implementation of the architecture. Local interconnections are important in minimizing signal delay, and the regular structure allows easy testability and simplifies the layout of the architecture.

The key equation which defines the relationship of the error locator and evaluator polynomials from the syndromes is given as follows:

$$S(z)\Lambda(z) = \omega(z) \bmod z^{2t}$$

where:
 S(z)=are the code syndromes for a code word C(z),
 $\Lambda$=is the error-locator polynomial which has roots at the error locations,
 $\omega(z)$=is an error evaluator
polynomial t is the number of errors in the code word.

The computation of syndromes from the received code word is readily implemented using a Fourier transform of the received vector, and computation of the error locations and magnitudes after the polynomials are identified is readily implemented. Both processes entail a number of operations which can be performed in parallel. The time consuming aspect of the decoding procedure lies in the computation of the error locator and error evaluator polynomials from the syndromes. In accordance with the invention this is accomplished in accordance with the following algorithm where $R_i$, $P_i$ and $T_i$ are column vectors of length 2t and where t is the number of errors the code can correct:

ALGORITHM SUMMARY $$\begin{bmatrix} z^{-1}R_2^{(i)} \\ R_1^{(i)} \end{bmatrix} = \begin{bmatrix} z^{-1} & 0 \\ 0 & 1 \end{bmatrix} \begin{bmatrix} 1 - \rho_i \\ \gamma_i(1 - \gamma_i) \end{bmatrix} \begin{bmatrix} z^{-1}R_2^{(i-1)} \\ R_1^{(i-1)} \end{bmatrix}$$

-continued
ALGORITHM SUMMARY $$\begin{bmatrix} z^{-1}P_2^{(i)} \\ P_1^{(i)} \end{bmatrix} = \begin{bmatrix} z^{-1} & 0 \\ 0 & 1 \end{bmatrix} \begin{bmatrix} 1 & -\rho_i \\ \gamma_i(1 & -\gamma_i) \end{bmatrix} \begin{bmatrix} z^{-1}P_2^{(i-1)} \\ P_1^{(i-1)} \end{bmatrix}$$

$$\begin{bmatrix} z^{-1}T_2^{(i)} \\ T_1^{(i)} \end{bmatrix} = \begin{bmatrix} z^{-1} & 0 \\ 0 & 1 \end{bmatrix} \begin{bmatrix} 1 & -\rho_i \\ \gamma_i(1 & -\gamma_i) \end{bmatrix} \begin{bmatrix} z^{-1}T_2^{(i-1)} \\ T_1^{(i-1)} \end{bmatrix}$$

$\rho_i$ = top element $z^{-1}R_2^{(i-1)}$/top element $R_1^{(i-1)}$
$N_i = \overline{N}_{i-1} + 1$ $$\overline{N}_i = \begin{cases} -N_i \; N_i > 0, \rho_i \neq 0 \\ N_i \text{ otherwise} \end{cases}$$

$$\gamma_i = \begin{cases} 1 \; N_i > 0, \rho_i \neq 0 \\ 0 \text{ otherwise} \end{cases}$$

$\overline{N}_0 = 0$
$z^{-1}R_2^{(0)} = [S_1 \ldots S_{2t}]^T \; R_1^{(0)} = [1 \ldots 0]^T$
$z^{-1}P_2^{(0)} = [0 \ldots 0 \; 1]^T \; P_1^{(0)} = [0 \ldots 0]^T$
$z^{-1}T_2^{(0)} = [0 \ldots 0]^T \; T_1^{(0)} = [0 \ldots 0 - 1]^T$
$z^{-1}P_2^{(2t)} = [1\Lambda_0 \ldots \Lambda_{2t-1}]^T$
$z^{-1}T_2^{(2t)} = [\omega_1 \ldots \omega_{2t}]^T$ Importantly, this algorithm is readily implemented in a systolic processor employing a parallel structure and pipeline techniques and which provides a regular set of recursions which lends itself to fabrication using integrated circuit technology.

The invention and objects and features thereof will be more readily apparent from the following detailed description and appended claims when taken with the drawing, in which:

FIG. 2 is an example of implementing the key equation.

FIG. 3A is a schematic of a generic pipelined multiplier, and FIG. 3B is a schematic of one embodiment of a multiplier algorithm in accordance with the invention.

FIG. 4 is a functional block diagram of another implementation of the algorithm in accordance with the invention.

FIG. 5 is a functional block diagram of another implementation of the algorithm in accordance with the invention.

FIG. 6 is a schematic of a cell in the circuit of FIG. 5.

FIG. 7 is a schematic of another cell in the circuit of FIG. 5.

FIG. 8 is a functional block diagram of implementation of Berlekemp-Massey algorithm.

FIG. 9 is a functional block diagram of a fully pipelined array in accordance with the invention.

FIGS. 10a and 10b are schematics of cells in the array of FIG. 9.

FIG. 11 is a schematic diagram illustrating pipeline operation on the syndrome sets.

Figure 1:
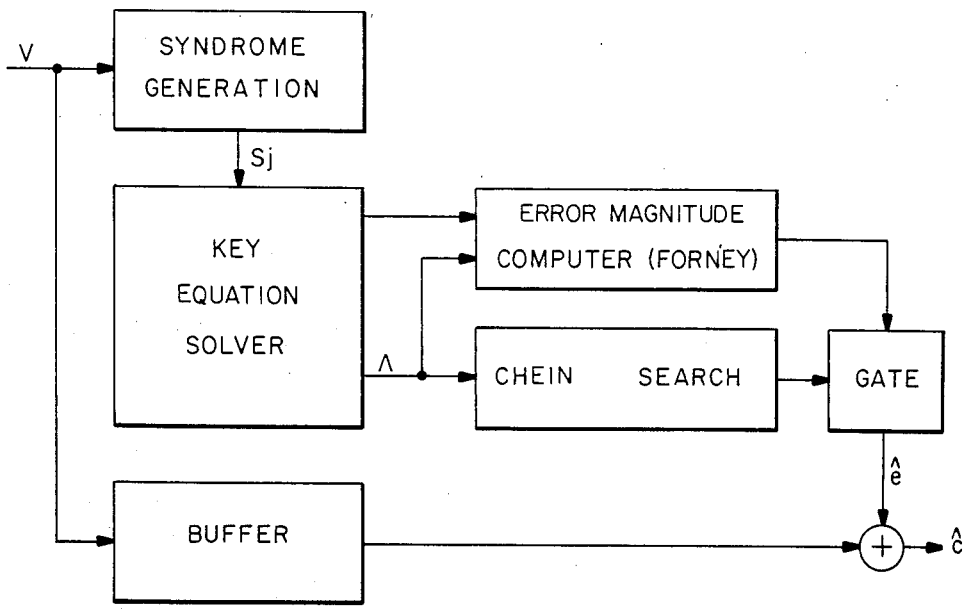
FIG. 1 is a functional block diagram of the operations in decoding a vector using the key equation.

Referring now to the drawings, FIG. 1 is a functional block diagram of the operations in decoding a vector v, consisting of a code word c, plus error, e. As noted above, errors in the code word can be identified from roots of an error-locator polynomial, $\Lambda(z)$, and an error evaluator polynomial, $\omega(z)$, both of which are defined from the code syndromes, S, in accordance with the key equation first derived by Berlekemp as follows:

$$S(z)\lambda(z) = \omega(z) \bmod Z^{2t}$$

In FIG. 1 the syndromes, $S_j$, are generated by Fourier transform of the vector, v. The number of syndromes must be at least twice the number of errors, t, in the code vector. Using the syndromes, $S_j$, the key equation is solved to define the error magnitude polynomial, $\omega(z)$, and the error locator polynomial, $\lambda(z)$. Roots of these polynomials are then gated to correct the vector, v, which is passed through a suitable time buffer for error corrections.

The key equation processor is the limiting factor in identifying and correcting errors in code. In accordance with the present invention a regular, pipelined matrix processor is provided which is readily implemented using integrated circuit technology and which can timely operate on high speed code. For example, with satellite code rates of 500 Mbs/second a processor clock rate of only 27.5 MHz is required. The algorithm which permits the systolic processor will first be derived, and then the matrix and cell structures of the processor will be described.

CODE DEFINITION

We shall denote by the triple (n,k,t) a primitive BCH code having: block-length n, information length k, and the ability to correct t random errors. The codes is assumed to be q-ary and thus has symbols in GF(q), the Galois field containing q elements. We represent a codeword, $[c_0, \ldots, c_{n-1}]$, by its naturally associated polynomial c(z). For BCH codes, every codeword has the property that $$c(\alpha^j) = \sum_{i=0}^{n-1} c_i \alpha^{ij} = 0 \tag{1}$$

$j = m_0, \ldots, m_0 + 2t - 1$ where $\alpha$ is the primitive element of the extension field $GF(q^m)$. m is the smallest integer such that n divides $q^m - 1$. For simplicity, we will take $m_0$ to be 1.

DECODING PROCEDURE

Given a received word, v(z), we wish to recover the transmitted codeword. This is typically accomplished in three steps. Note that v(z) is the sum of the transmitted codeword, c(z), and some error pattern, r(z). The first decoding step is to compute the code syndromes, $S_j$.

$$v(x) = c(x) + r(x) \tag{2}$$

$$S_j = v(\alpha^j) = \sum_{i=0}^{n-1} v_i \alpha^{ij} = \sum_{i \in E} r_i (\alpha^i)^j$$

$j = 1, \ldots, 2t$

E is a set specifying the indices of the error locations. Thus, $\alpha^i$ can be thought of as the "location" of one of the errors. (Of course, the error location is actually the $\log_\alpha$ of $\alpha^i$. However, $\alpha^i$ is usually referred to as the error location.) We observe that the syndromes are nonlinear in the error locations. Thus, introduce the error-locator polynomial, $\Lambda(z)$, which has its roots at the error locations. The relationship between the error-locator polynomial and the syndromes is linear.

$$S(z)\Lambda(z) = \omega(z) \bmod z^{2t} \quad (3)$$
where
$$S(z) = \sum_{j=1}^{2t} S_j z^{j-1}$$
$$\Lambda(z) = 1 + \sum_{j=1}^{t} \Lambda_j z^{j-1}$$
$$\deg \Lambda(z) \leq t$$
$$\deg \omega(z) < t$$

Equation (3) is known as the key equation. $\omega(z)$ is the error-evaluator polynomial. The roots of the error-locator polynomial yield the error locations. Error magnitudes are computed using both the error-locator and error-evaluator polynomials as shown in (4).

$$\tau_i = \frac{\omega(\alpha^i)}{\Lambda'(\alpha^i)} \quad i \in E \quad (4)$$

$\Lambda'$ is the formal derivative of $\Lambda$. We remark that it is possible to find the error magnitudes from $\Lambda$ alone. For this reason, we will only discuss the computation of $\Lambda$ when deriving our new procedure. It possible, however, to use the new technique to compute $\omega$ also.

One may observe that the first and last steps of the decoding process are well defined and fairly regular. However, the solution of the key equation is not so easy to see. In fact, the usual bottleneck in decoding is the solution of the key equation. The algorithm and architecture presented here are an attempt to "regularize" the solution to the key equation.

Linear recurrences and the key equation

The key equation may be written, $$S_k + \sum_{i=1}^{k-1} \Lambda_i S_{k-i} = \omega_k \quad k \leq t \quad (5)$$

$$S_k + \sum_{i=1}^{t} \Lambda_i S_{k-i} = 0 \quad k > t$$

This formulation suggests that we interpret $\Lambda(z)$ as the tap gains for a feedback shift register. In this sense, the key equation asks that we find the shortest shift register that generates the given syndromes when the shift register is initialized with $\omega(z)$. Alternatively, using the equation for $k>t$, we can think $\Lambda(z)$ as the shortest linear recurrence relation which generates $S(z)$.

To demonstrate the simplicity of our new algorithm, consider an example with integers. Let the given sequence be $\{1,1,2,2,4,3,6,1\}$. Solving the problem requires 8 iterations since there are eight values to "match". These are displayed in FIG. 2. Note that the algorithm requires that we store two columns of data at every step. Each of these columns has two parts, separated by a dotted line. The right column contains the present estimate of the linear recurrence and sequence it generates. The left column contains a past estimate of the recurrence and its associated sequence. The numbers above the line are modified values of the given sequence and those below are estimates for the linear recurrence. At the $i^{th}$ iteration, the present estimate of the linear recurrence is the shortest such recurrence which generates the first i values of the sequence.

The objective of each iteration is to use the top element of the left column (call it a) to null the top element of the right column (call it b). Thus, multiply the left column by $-b/a$ and add it to the right column. Then shift the right column up one to remove the zero element. The dotted line also shifts up one. Finally the left column either stays the same or gets the old contents of the right column depending on the value of the control $\gamma$. If new top element in the right column is zero, only the shift step is performed. In FIG. 1, $-\Gamma$ is the ratio $-b/a$ and, N and N' are controls which determine $\gamma$.

From FIG. 2, we see that the solution the algorithm provides is $\{1,-2,-1,5,-3\}$. Correctness is easily verified.

ALGORITHM DERIVATION—FACTORIZATION OF HANKEL MATRICES

For any particular solution order, say k, the key equation may be written in matrix form, $$\begin{bmatrix} & & & S_1 \\ & \bigcirc & & \vdots \\ & & S_1 & S_k \\ S_1 & S_2 & \ldots & S_{k+1} \\ \vdots & & & \vdots \\ \vdots & & & \vdots \\ S_k & \ldots & & S_{2k} \\ \vdots & & & \vdots \\ S_{2t-k} & \ldots & & S_{2t} \end{bmatrix} \begin{bmatrix} A_k \\ \vdots \\ \vdots \\ \vdots \\ A_1 \\ 1 \end{bmatrix} = \begin{bmatrix} \omega_1 \\ \vdots \\ \omega_k \\ 0 \\ \vdots \\ \vdots \\ 0 \end{bmatrix} \quad (6)$$

where
$\Lambda(z) = 1 + \Lambda_1 z + \ldots + \Lambda_t z^t$
$\omega(z) = \omega_1 + \ldots + \omega_t z^{t-1}$
= 0's as needed to complete the matrix.

From this set of equations, it is clear that $\omega(z)$ may be easily found via back substitution once $\Lambda(z)$ is known. The crux of the problem is to find $\Lambda(z)$ using the matrix equation $$\begin{bmatrix} S_1 & \ldots & S_{k+1} \\ \vdots & & \vdots \\ \vdots & & \vdots \\ S_k & \ldots & S_{2k} \end{bmatrix} \begin{bmatrix} A_k \\ \vdots \\ \vdots \\ A_1 \\ 1 \end{bmatrix} = 0 \quad (7)$$

It would seem that our task has been reduced to a Hankel matrix inversion. However, two key properties of this matrix problem preclude the use of typical Hankel or Toeplitz problem solvers. First, the order of the solution is unknown a priori (we don't know how many errors have occurred). Second, the leading minors of this Hankel matrix can be singular.

To solve the key equation from a matrix point of view, we require three steps. Our first assumption will be that the solution order is known and the principle leading minors of M are non-singular. The former assumption makes matrix equivalence quite clear while the latter simplifies the initial algorithm derivation. We next relax the non-singular minor assumption. Under this condition we again derive an efficient algorithm for solving (7). Interestingly, eliminating the non-singular minor assumption does not add tremendous complication. Finally, we will show that solving the matrix problem also leads to a solution of the key equation even when the solution order is unknown.

So, for the moment, let us assume that the solution order is known, say t. How do we proceed? The matrix equation can be solved iteratively by recursively factoring the matrix $M(t,t+1)$ into upper and lower triangular matrices of the form, $$M(t,t+1) \begin{bmatrix} 1 & x & x & \ldots & a_t \\ & 1 & x & & \vdots \\ & & 1 & & \vdots \\ & & & \ddots & \vdots \\ & & & & a_1 \\ \bigcirc & & & & 1 \end{bmatrix} = \begin{bmatrix} x & & & & \\ & \ddots & & & \bigcirc \\ & & \ddots & & \\ & & & \ddots & \\ \bigcirc & & & & \\ & x & \ldots & x & 0 \end{bmatrix} \tag{8}$$

or, $$M(t,t+1)P(t+1,t+1) = Q(t,t+1)$$

From this equation we see that the last column of P satisfies (7). Thus, $\Lambda_i = a_i$. Recursively factoring M yields the desired solution vector. Because we assume that the principle leading minors of M are non-singular, the x's on Q's diagonal are non-zero.

To generate the desired recursion, suppose that $p_{k-1}$ and $p_k$, the k and k+1 columns of P, are known. Thus, $$M(t,t+1)[p_{k-1}\ p_k] = \begin{bmatrix} 0 & 0 \\ \vdots & \vdots \\ 0 & 0 \\ \beta^{(0)}_{k-1} & 0 \\ \beta^{(1)}_{k-1} & \beta^{(0)}_k \\ \vdots & \vdots \\ \beta^{(t-k)}_{k-1} & \beta^{(t-k-1)}_k \end{bmatrix} \tag{9}$$

where
$Q = [\beta_0 \ldots \beta_t]$
$\beta_i[0 \ldots 0 \beta_i^{(0)} \ldots \beta_i^{(t-i)}]$
$p = [p_0 \ldots p_t]$ As a trial solution for $p_{k+1}$, consider $zp_k$ where z is a downward shift operator. Because of the shift invariance of Hankel matrices, the result of multiplying $M(t,t+1)$ by $zp_k$ is $$M(t,t+1)[p_{k-1}\ p_k\ zp_k] = \begin{bmatrix} 0 & 0 & 0 \\ \vdots & \vdots & \vdots \\ 0 & 0 & 0 \\ \boxed{\beta^{(0)}_{k-1}} & 0 & \beta^{(0)}_k \\ \beta^{(1)}_{k-1} & \boxed{\beta^{(0)}_k} & \beta^{(1)}_k \\ \vdots & \vdots & \vdots \\ \beta^{(t-k)}_{k-1} & \beta^{(t-k-1)}_k & \beta^{(t-k)}_k \end{bmatrix} \tag{10}$$

$zp_k$ causes $\beta_k$ to shift up one ($zp_k \to z^{-1}\beta_k$). Recall that our objective is to triangularize M. Thus $P_{k+1}$ can be computed using the circled pivot elements.

The recursion for generating P can be written $$P_{k+1} = (z - \gamma_k)P_k - \delta_k P_{k-1} \tag{11a}$$

$$\delta_k = \frac{\beta_k^{(0)}}{\beta_{k-1}^{(0)}} \quad \gamma_k = \frac{\beta_k^{(1)}}{\beta_k^{(0)}} - \frac{\beta_{k-1}^{(1)}}{\beta_{k-1}^{(0)}}$$

An analogous polynomial formulation can be obtained by making a natural association between $p_k$ and $p_k(z)$. Namely, the ith element (from top) of $p_k$ is the coefficient of $z^{t-i+1}$ in $p_k(z)$. Hence, $$p_{k+1}(z) = (z-\gamma_k)p_k(z) - \delta_k p_{k-1}(z) \tag{11b}$$

This is the polynomial version of an algorithm developed by Lanczos for inverting Hankel matrices with non-singular leading minors. In a sense, this is a parallel algorithm. That is, if we interpret vector scaling and addition as parallel operations. The real trick is to obtain the pivots at the proper time.

How do we put (11) in a form suitable for hardware implementation? It seems natural to divide the process into two steps. First, triangularize $M(n,n+1)$ to obtain $\delta_i$ and $\gamma_i$. Then using these values, compute the columns of P. Parallelism can be introduced by performing vector scaling and addition in parallel.

The algorithm which we propose will operate on the augmented matrix $\tilde{M}$.

$$\tilde{M} = \begin{bmatrix} S_1 & \ldots & S_t & S_{t+1} & \ldots & S_{2t} \\ \vdots & & \vdots & \vdots & & \vdots \\ S_{t-1} & \ldots & S_{2t-2} & S_{2t-1} & & \\ S_t & \ldots & S_{2t-1} & S_{2t} & & \\ S_{t+1} & \ldots & S_{2t} & & & \\ \vdots & & & & \bigcirc & \\ S_{2t} & & & & & \end{bmatrix} \tag{12}$$

The reason for using $\tilde{M}$ becomes clear by examining (10). As a result of iteration k−1, $\beta_{k-1}^{(0)} \ldots \beta_{k-1}^{(t-k)}$ and $\beta_k^{(0)} \ldots \beta_k^{(t-k-1)}$ have been computed. However, in order to complete iteration k we need $\beta_k^{(t-k)}$. One could form $\beta_k^{(t-k)}$ by taking the inner product of $p_k$ and $[S_{t+1} \ldots S_{2t}, 0]$. Yet, an inner product is an undesirable operation because it introduces a global sum. By using $\tilde{M}$ this inner product is eliminated. All the necessary $\beta$'s appear as a natural result at every step.

To begin the algorithm derivation assume that we have $p_{k-1}$ and $p_k$, and wish to find $p_{k+1}$. Although, the new algorithm stores $z^{k-1}p_{k-1}$ and $z^{k-1}p_k$. By doing so the pivot values always appear at the top of each column. This simplifies hardware implementation.

$$\tilde{M}[z^{k-1}p_{k-1}\ z^{k-1}p_k] = \begin{bmatrix} \beta_{k-1}^{(0)} & 0 \\ \beta_{k-1}^{(1)} & \beta_k^{(0)} \\ \vdots & \vdots \\ \beta_{k-1}^{(at-k+1)} & \beta_k^{(at-k)} \\ 0 & 0 \\ \vdots & \vdots \\ 0 & 0 \end{bmatrix} = R$$

It is easy to verify that $\beta_k^{(0)}, \ldots, \beta_k^{(t-k-1)}$ are that same as in (9).

$p_{k+1}$ can be obtained by forcing two zeros as in (9). The first step is to align the columns of R.

$$\tilde{M}[z^{k-1}p_{k-1}\ z^k p_k] = \begin{bmatrix} \beta_{k-1}^{(0)} & \beta_k^{(0)} \\ \vdots & \vdots \end{bmatrix}$$

Then the first zero is forced using $\beta_{k-1}^{(0)}$ as a pivot. Note that $\beta_k^{(0)}$ will be used as the pivot in the next step. Thus we place $\beta_k$ in the first column of R $$\tilde{M}[z^k p_k\ z^k p_k - \delta_k z^{k-1}p_{k-1}] = \begin{bmatrix} \beta_k^{(0)} & 0 \\ \beta_k^{(1)} & \alpha_k^{(0)} \\ \vdots & \vdots \end{bmatrix}$$

$\alpha_k$ is an intermediate result. Once again we align the columns of R $$\tilde{M}[z^k p_k z^{k+1}p_k - \delta_k z^k p_{k-1}] = \begin{bmatrix} \beta_{k-1}^{(0)} & \alpha_k^{(0)} \\ \vdots & \vdots \end{bmatrix}$$

The second zero is force using $\alpha_k^{(0)}/\beta_k^{(0)}$ which is $\gamma_k$. Thus, the new second column of R is $$\tilde{M}(z^{k+1}p_k - \delta_k z^k p_{k-1} - \gamma_k z^k p_k) = \tilde{M}(z^k p_{k+1})$$

$$\tilde{M}[z^k p_k z^k p_{k+1}] = \begin{bmatrix} \beta_k^{(0)} & 0 \\ \beta_k^{(1)} & \beta_{k+1}^{(0)} \\ \vdots & \vdots \end{bmatrix}$$

This leaves us ready to compute $p_{k+2}$. We note that the last step of the overall algorithm will provide us with $z^{t-1}p_t$. The multiplier $z^{t-1}$ is simply a shift.

To complete the algorithm, an initialization procedure must be specified. Of course we always have $p_0$ equal to 1. Since the leading principle minors are non-singular, $S_1 \neq 0$. Thus, $$p_2 = \left(z - \frac{S_2}{S_1}\right) p_1$$

In terms of our algorithm, this can be accomplished by the following steps, $$\tilde{M}[p_0 p_0] = \begin{bmatrix} S_1 & S_1 \\ \vdots & \vdots \\ \vdots & \vdots \end{bmatrix}$$

$$\tilde{M}[p_0 z p_0] = \begin{bmatrix} S_1 & S_2 \\ \vdots & \vdots \\ \vdots & \vdots \end{bmatrix}$$

$$\tilde{M}\left[p_0\left(z - \frac{S_2}{S_1}\right) p_0\right] = \begin{bmatrix} S_1 & 0 \\ & \beta_1^{(0)} \\ \vdots & \vdots \\ \vdots & \vdots \end{bmatrix}$$

$$= \tilde{M}[p_0 p_1]$$

The entire algorithm is then summarized by $$\begin{bmatrix} R_2^{(i)} \\ R_1^{(i)} \end{bmatrix} = \begin{bmatrix} z^{-1} & \rho_i \\ z^{-1}\gamma_i & (1-\gamma_i) \end{bmatrix} \begin{bmatrix} R_2^{(i-1)} \\ R_1^{(i-1)} \end{bmatrix} \quad i = 1, \ldots, 2t \quad (13)$$

$\gamma_i = 1 - \gamma_i \quad \gamma_0 = 1$ $\rho_i =$ top element $z^{-1}R_2^{(i-1)}/$top element $R_1^{(i-1)}$ $R_2^{(0)} = R_1^{(0)} = [S_1 \ldots S_{2t}]^T$ The recursions for computing $\Lambda(z)$ are easily found from (11) and (13). Let $P_1^{(i)}$ and $P_2^{(i)}$ be the columns of P corresponding to $R_1^{(i)}$ and $R_2^{(i)}$. Then, $$\begin{bmatrix} P_2^{(i)} \\ P_1^{(i)} \end{bmatrix} = \begin{bmatrix} z & \rho_i \\ z\gamma_i & (1-\gamma_i) \end{bmatrix} \begin{bmatrix} P_2^{(i-1)} \\ P_1^{(i-1)} \end{bmatrix} \quad i = 1, \ldots, 2t \quad (14)$$

$R_2^{(0)} = R_1^{(0)} = [10 \ldots 0]^T$

The structure of (13) and (14) make a hardware translation of the algorithm very straightforward. We would require two columns of storage registers and a processing node between adjacent elements in each column. Except for the pivot information, only local interconnections are required.

The issue now is, can this method be extended to the more realistic case in which singular minors can occur?

The answer can be found by re-examining equation (10). When the k by k principle leading minor of M is singular, some of the $\beta_k^{(i)}$ will be zero. This would leave us with, $$M(t,t+1)[P_{k-1}P_k] = \begin{bmatrix} 0 & 0 \\ \cdot & \cdot \\ \cdot & \cdot \\ \cdot & \cdot \\ 0 & 0 \\ \beta_{k-1}^{(0)} & 0 \\ \cdot & \cdot \\ \cdot & \cdot \\ \beta_{k-1}^{(\eta k)} & \beta_k^{(0)} \\ \cdot & \cdot \\ \cdot & \cdot \\ \beta_{k-1}^{(t-k)} & \beta_k^{(t-k-\eta k)} \end{bmatrix}$$

The $\eta_k$ "extra" zeros that appear are the result of some "free" matches. In other words, the recurrence relation for the first k parameters actually generates the first $k+\eta_k$ parameters.

Consequently, the next step is to find $p_{k+\eta k}$. Because of the free matches, $zp_k$ will not suffice as a trial solution. Instead, we require $zp_k \ldots z^\eta P_k$.

$$M(t,t+1)[P_{k-1} P_k zP_k \ldots z^{\eta k}P_k] = \qquad (15)$$

$$\begin{bmatrix} 0 & & 0 & 0 \\ \boxed{\beta_{k-1}^{(0)}} & & 0 & \beta_k^{(0)} \\ \beta_{k-1}^{(1)} & & \boxed{\beta_k^{(0)}} & \beta_k^{(1)} \\ \cdot & & \cdot & \cdot \\ \cdot & & \cdot & \cdot \\ \beta_{k-1}^{(\eta k-1)} & \boxed{\beta_k^{(0)}} & \ldots & \beta_k^{(\eta k-2)} & \beta_k^{(\eta k-1)} \\ \beta_{k-1}^{(\eta k)} & \boxed{\beta_k^{(0)}}\beta_k^{(1)} & \ldots & \beta_k^{(\eta k-1)} & \beta_k^{(\eta k)} \\ \cdot & & & & \cdot \end{bmatrix}$$

The necessary pivot elements are circled. From (15), the update recursion is easily found, $$p_{k+\eta k}(z) = \gamma_k(z)p_k(z) - \delta_k p_{k-1}(z) \qquad (16)$$

where $$\delta_k = \beta_k^{(O)}/\beta_{k-1}^{(O)}$$

$$\gamma_k(z) = z^{\eta k} - [1 \; z \ldots z^{\eta k-1}] \begin{bmatrix} \bigcirc & & \beta_k^{(0)} \\ & \cdot & \beta_k^{(1)} \\ & \cdot & \cdot \\ \beta_k^{(0)} & \beta_k^{(1)} \ldots & \beta_k^{(\eta k-1)} \end{bmatrix}^{-1}$$

$$* \left\{ \begin{bmatrix} \beta_k^{(1)} \\ \cdot \\ \cdot \\ \beta_k^{(\eta k)} \end{bmatrix} - \delta_k \begin{bmatrix} \beta_{k-1}^{(1)} \\ \cdot \\ \cdot \\ \beta_{k-1}^{(\eta k)} \end{bmatrix} \right\}$$

This is known as the Generalized Lanczos Recursion and was developed by S. Y. Kung. A remark is necessary here. In the non-singular case, Lanczos' algorithm computed every column of P. However, the singular case requires that we compute only those columns which correspond to non-singular minors. The other columns of P are simply shifted versions of the computed columns (this results from free matches). To label the computed columns, let $v_k$ be the index corresponding to the $k^{th}$ non-singular minor. Also, $\eta_k = v_{k+1} - v_k$. The Generalized Lanczos Algorithm computes $\{P_{v_t}: k=1, \ldots, T\}$. T is the number of non-singular principle leading minors. Thus, P has the form, $$P = [p_0 z p_0 \ldots z^{\eta_0 - 1} p_0 \ldots p_{T-1} z p_{T-1} \ldots z^{\eta_T - 1 - 1} p_{T-1} p_T]$$

In general, the algorithm will start each interation with $p_{v_{k-1}}$ and $p_{v_k}$ in order to computer $p_{v_{k+i}}$.

The Generalized Lanczos Algorithm tells us how to computer $p_{v_{k+1}}$, but it is not really suitable for hardware implementation. At every step of algorithm requires us to invert a matrix that has variable dimensions. Yet it is possible to obtain a new formulation of the algorithm which looks very similar to the parallel algorithm that we developed for Lanczos' recursion. From above we may observe that the matrix inversion is required because we are trying to force the requisite zeros all at once. Another point is the matrix that has to be inverted possesses a great deal of structure. Each column is a shifted copy of a later column. These facts lead one to believe that by forcing zeros one at a time a certain amount of complexity can be removed. In fact, by doing so the new algorithm will require only 2t iterations with same hardware described previously. The only additional burden is an increased control complexity. Thus, the more general case (singular minors) does not require drastically more hardware.

To generate the new algorithm, we again start with the augmented matrix $\tilde{M}$. Assume that we have $p_{v_{k-1}}$ and $p_{v_k}$ and wish to find $p_{v_{k+1}}$. Thus, $$\tilde{M}[z^{v_k-1}p_{v_{k-1}}z^{v_k-1}p_{v_k}] = \begin{bmatrix} \beta_{v_k-1}^{(0)} & 0 \\ \cdot & \cdot \\ \cdot & \cdot \\ \beta_{v_k-1}^{(\eta k)} & \beta_{v_k}^{(o)} \\ \cdot & \cdot \\ \cdot & \cdot \\ \beta_{v_k-1}^{(2t-v_k-1)} & \beta_{v_k}^{(2t-v_k)} \\ 0 & 0 \\ \cdot & \cdot \\ \cdot & \cdot \\ 0 & 0 \end{bmatrix} = R$$

The first step is the algorithm is to align the columns of R. This requires $\eta_k$ shifts.

$$\tilde{M}[z^{\nu_k-1}p_{\nu_k-1}z^{\nu_k+1-1}p_{\nu_k}] = \begin{bmatrix} \beta^{(0)}_{\nu_k-1} & \beta^{(0)}_{\nu_k} \\ \cdot & \cdot \\ \cdot & \cdot \\ \cdot & \cdot \end{bmatrix}$$

Then the first zero is forced using $\beta_{\nu_k-1}^{(0)}$. From (15) note that $\beta_{\nu_k}^{(0)}$ will be needed as the next pivot. Thus, we place $\beta_{\nu_k}$ in the first column of R. Note that $\nu_{k+1} = \nu_k + \eta_k$.

$$\tilde{M}[z^{\nu_k+1-1}p_{\nu_k}z^{\nu_k+1-1}p_{\nu_k} - \delta_{\nu_k}z^{\nu_k-1}p_{\nu_k-1}] = \begin{bmatrix} \beta^{(0)}_{\nu_k} & 0 \\ \beta^{(1)}_{\nu_k} & \alpha^{(0)}_1 \\ \cdot & \cdot \\ \cdot & \cdot \end{bmatrix}$$

The remaining $\eta_k$ iterations all use $\beta_{\nu_k}^{(0)}$ as a pivot. In the non-singular case, only one additional iteration was required. Each iteration consists of two steps:
(1) shift the right column up until a nonzero element appears at the top and (2) use the left column to annihilate the the top element in the right column. After $\eta_k$ iterations we obtain $$\tilde{M}[z^{\nu_k+1-1}p_{\nu_k}z^{\nu_k+1-1}\hat{p}_{\nu_k+1}] = \begin{bmatrix} \beta^{(0)}_{\nu_k} & 0 \\ \beta^{(1)}_{\nu_k} & \alpha^{(0)}_{\eta_k+1} \\ \cdot & \cdot \\ \cdot & \cdot \end{bmatrix}$$

where $$\hat{p}_{\nu_k+1} = -\delta_{\nu_k}p_{\nu_k-1} + p_{\nu_k}\left[z^{\eta_k} - \frac{1}{\beta_{\nu_k}^{(0)}}\sum_{i=1}^{\eta_k}\alpha_i z^{\eta_k-i}\right]$$

It is intuitively obvious from (15) that $\hat{p}_{\nu_k+1}$ is in fact $p_{\nu_k+1}$. This follows because our procedure is simply using the pivots in (15) one at a time. Hence, $$\tilde{M}[z^{\nu_k+1-1}p_{\nu_k}z^{\nu_k+1-1}p_{\nu_k+1}] = \begin{bmatrix} \beta^{(0)}_{\nu_k} & 0 \\ \beta^{(1)}_{\nu_k} & \beta^{(0)}_{\nu_k+1} \\ \cdot & \cdot \\ \cdot & \cdot \end{bmatrix}$$

This leaves us ready to compute $p_{\nu_k+2}$. We remark here that is is possible to verify the correctness of the algorithm by showing the solution conicides with (16).

The new algorithm for computing $p_{\nu_k+1}$ is summarized in (17).

$$\begin{bmatrix} R_2^{(i)} \\ R_1^{(i)} \end{bmatrix} = \begin{bmatrix} z^{-1} & \rho_i \\ z^{-1}\gamma_i & (1-\gamma_i) \end{bmatrix} \begin{bmatrix} R_2^{(i-1)} \\ R_1^{(i-1)} \end{bmatrix} \quad (17)$$

$i = 1, \ldots, \eta_k + 1$ $$\begin{bmatrix} P_2^{(i)} \\ P_1^{(i)} \end{bmatrix} = \begin{bmatrix} z & \rho_i \\ z\gamma_i & (1-\gamma_i) \end{bmatrix} \begin{bmatrix} P_2^{(i-1)} \\ P_1^{(i-1)} \end{bmatrix}$$

$\rho_i = $ top element $z^{-1}R_2^{(i-1)}$/top element $R_1^{(i-1)}$ $\gamma_i = \begin{cases} 1 & i = 1 \\ 0 & \text{otherwise} \end{cases}$ $R_2^{(0)} = z^{-(\nu_k+1-2)}\beta_{\nu_k} \quad R_1^{(0)} = z^{-(\nu_k-1)}\beta_{\nu_k-1}$ $P_2^{(0)} = z^{\nu_k+1-2}p_{\nu_k} \quad P_1^{(0)} = z^{\nu_k-1}p_{\nu_k-1}$ $R_2^{(\eta_k+1)} = z^{-(\nu_k+1-1)}\beta_{\nu_k+1} \quad R_1^{(\eta_k+1)} = z^{-(\nu_k+1-1)}\beta_{\nu_k}$ $P_2^{(\eta_k+1)} = z^{\nu_k+1-1}p_{\nu_k+1} \quad P_1^{(\eta_k+1)} = z^{\nu_k+1-1}p_{\nu_k}$ where it is assumed that $R_1$ and $R_2$ have already been aligned (see initialization). Of course, our true desire is to factor the Hankel matrix M, ergo the need to compute $p_{\nu_k}$ for all k. This could be accomplished by invoking an "outer" recursion which called (17) for each value of k. Each iteration would consist of: (1) initialize the recursions on (17) with $p_{\nu_k-1}$, $p_{\nu_k}$, $\beta_{\nu_k-1}$ and $\beta_{\nu_k}$, then (2) run the recursions in (17) for $\eta_k + 1$ steps. After T iterations of the outer recursion, $p_T$ would have been computed. As described (17) can be thought of as an "inner" recursion of the overall algorithm. In comparison with the Generalized Lanczos, this new procedure possesses two important advantages. First, the matrix inversion has been eliminated. Second, all the necessary pivot information is available as a natural result at each step. These improvements greatly simplify hardware implementation.

Further gains would be achieved if it were feasiable to simply initialize (17) and let it run. However, this is not immediately possible. The root cause is that $\gamma_i$ is determined using an index which is measured with respect to $p_{\nu_k}$. Hence the need for the inner and outer recursions outlined above. The outer recursion marks the points where $p_{\nu_k}$ has been computed. To eliminate the outer recursion, we need a control law which does this automatically.

We note that the initialization responsibility of the outer recursion also includes aligning $R_1$ and $R_2$, i.e. shifting $R_2$ by $\theta_k$. This task is easily absorbed into the inner recursion. A modified set of equations is shown in (18).

$$\begin{bmatrix} R_2^{(i)} \\ R_1^{(i)} \end{bmatrix} = \begin{bmatrix} z^{-1} & -\rho_i \\ z^{-1}\gamma_i & (1-\gamma_i) \end{bmatrix} \begin{bmatrix} R_2^{(i-1)} \\ R_1^{(i-1)} \end{bmatrix} \quad (18)$$

$i = 1, \ldots, 2\eta_k$ $\gamma_i = \begin{cases} 1 & i = \eta_k \\ 0 & \text{otherwise} \end{cases}$ $\rho_i = $ top element $z^{-1}R_2^{(i-1)}$/top element $R_1^{(i-1)}$ $R_2^{(0)} = z^{-(\nu_k-1)}\beta_{\nu_k} \quad R_1^{(0)} = z^{-(\nu_k-1)}\beta_{\nu_k-1}$ The recursions for P are similar. Since $\rho_i$ is zero for $i = 1, \ldots, \eta_k - 1$, the extra $\eta_k - 1$ steps simply shift $R_2$. $\eta_k$ can be determined by observing that it corresponds to the number of times we must shift $R_2$ in order to make $p_j$ nonzero.

The sole remaining purpose of the outer recursion is to re-initialize the index for $\gamma$. To automate this, we need to examine the correspondences between $\gamma_i = 1$, the inner recursion and the outer recursion. This is done in Table 1.

TABLE 1

| Correspondence among recursion indices | | | | |
|---|---|---|---|---|
| Outer | Inner | Total Inner | $\gamma$ | $p$ |
| 0 | 0 | 0 | — | — |
|   | 1 | 1 | 0 | 0 |
|   | . | . | . | . |
|   | $\eta_1 - 1$ | $\eta_1 - 1$ | 0 | 0 |
|   | $\eta_1$ | $\eta_1$ | 1 | x |
|   | $\eta_1 + 1$ | $\eta_1 + 1$ | 0 | x |
|   | . | . | . | . |
| 1 | $2\eta_1$ | $2\eta_1$ | 0 | x |
|   | 1 | $2\eta_1 + 1$ | 0 | 0 |
|   | . | . | . | . |
|   | $\eta_1 - 1$ | $2\eta_1 + \eta_2 - 1$ | 0 | 0 |
|   | $\eta_2$ | $2\eta_1 + \eta_2$ | 1 | x |
|   | $\eta_2 + 1$ | $2\eta_1 + \eta_2 + 1$ | 0 | x |
|   | . | . | . | . |
| 2 | $2\eta_2$ | $2(\eta_1 + \eta_2)$ | 0 | x |

The inner and outer columns list the iteration number of the respective recursions. The column labeled "total inner" specifies the total number of inner recursions that have occurred. Our goal make $\gamma_i$ independent of the outer recursion. By doing so the outer recursion would become superfluous. Observe that while computing $p_{\nu 1}$, $\gamma_1$ is turned on when $R_1$ and $R_2$ have been aligned, i.e. after $\eta_1$ iterations. $\eta_1$ is the number of times we must shift in order to make $p$ non-zero. To complete the computation of $p_{\nu 1}$, $\eta_1$ more steps are required. $\gamma_1$ is zero during these iterations. Once $p_{\nu 1}$ is complete, $\gamma_2$ may be turned on as soon as the shifting process brings a non-zero element to the top of $R_2$. These remarks suggest the following control strategy for $\gamma$.

$$\overline{N}_0 = 0 \tag{19}$$

$$N_j = \overline{N}_{j-1} + 1$$

$$\overline{N}_j = \begin{cases} -N_j & N_j > 0, p_j \neq 0 \\ N_j & \text{otherwise} \end{cases}$$

$$\gamma_j = \begin{cases} 1 & N_j > 0, p_j \neq 0 \\ 0 & \text{otherwise} \end{cases}$$

When $N_j = 0$, we have completed the computation of a new column of P. When $N_j > 0$, the algorithm is aligning $R_1$ and $R_2$. And when $N_j < 0$, The recursions in (17) are being implemented. The point where N changes sign is where $\gamma$ becomes 1. By using this control, the outer recursion becomes unnecessary. We need only perform initialization and then let (18) run (with the control) until the data is exhausted. The contents of $P_2$ will be the solution to matrix problem given in (7).

To start the algorithm, we require knowledge of $p_0$ and $p_{\nu 1}$; however, while $p_0$ is always one, finding $p_{\nu 1}$ is not always so easy. Recall that $\nu_1$ marks the point where the first non-singular minor is found. Thus, if $S_1 \neq 0$ then $\nu_1 = 1$; otherwise, $\nu_1 > 1$. Suppose that the former is true and assume that at the beginning of iteration 2 we have, $$\widetilde{M}[p_0 p_0] = \begin{bmatrix} S_1 & S_1 \\ \cdot & \cdot \\ \cdot & \cdot \\ \cdot & \cdot \\ S_{2t} & S_{2t} \end{bmatrix} \tag{20}$$

$p_{\nu 1}$ can be formed in one step since $p_{\nu 1} = z - S_2/S_1$. At the beginning of iteration 3 the registers should contain, $$\widetilde{M}[p_0 p_{\nu 1}] = \begin{bmatrix} S_1 & 0 \\ \cdot & \beta_{\nu 1}^{(0)} \\ \cdot & \cdot \\ \cdot & \cdot \end{bmatrix}$$

From (17) and Table 1 we know that $N_3$ should be 1. Hence, $\overline{N}_2 = N_2 = 0$ and $\overline{N}_1 = -1$. This is essentially the same initialization that was utilized in the nonsingular case. Note also that the shifting in (20) is consistent with the requirements of page 17.

What if $S_1$ is zero? This means that the first minor of M is singular causing $\nu_1 > 1$. In the language of linear recurrences, $p_0$ is giving us some free matches. A method for computing $p_{\nu 1}$ can be derived by returning to the original matrix formulation of the problem.

$$\widetilde{M}[p_0 z p_0 \ldots z^{\eta_0 - 1} p_0 z^{\eta_0} p_0] =$$

$$\begin{bmatrix} & & & \textcircled{$S_{\eta_0}$} & S_{\eta_0 + 1} \\ \bigcirc & & \cdot & S_{\eta_0 + 1} & S_{\eta_0 + 2} \\ & \cdot & \cdot & \cdot & \cdot \\ & \textcircled{$S_{\eta_0}$} & \ldots & S_{2\eta_0 - 2} & S_{2\eta_0 - 1} \\ \textcircled{$S_{\eta_0}$} & S_{\eta_0 + 1} & \ldots & S_{2\eta_0 - 1} & S_{2\eta_0} \end{bmatrix}$$

By definition, $\beta_{\nu 1}$ has at least one more zero at the top than $\beta_0$. The circled pivot elements can be used to form $\beta_{\nu 1}$ and in the process $p_{\nu 1}$. The technique is similar to that used in (15); however, there are some slight differences. Of course the starting point must be, $$\widetilde{M}[z^{\eta_0 - 1} p_0 z^{\eta_0 - 1} p_0] = \begin{bmatrix} S_{\eta_0} & S_{\eta_0} \\ \cdot & \cdot \\ \cdot & \cdot \\ \cdot & \cdot \end{bmatrix} \tag{21}$$

Note that $p_0$ is used as the pivot in all of the $\eta_0$ steps for computing $p_{\nu 1}$. Hence, we must have $\overline{N}_{\eta_0 + 1} = -\eta_0 + 1$ (because $\eta_0$ steps must be used to from $z^{\eta_0 - 1} p_0$, the index of $\overline{N}$ is $\eta_0 + 1$). The contents of the register after iteration $2\eta_0$ are, $$\tilde{M}[z^{\eta_0-1}P_0 z^{\eta_0-1}P_{\nu_1}] = \begin{bmatrix} S_1 & 0 \\ \cdot & \beta_{\nu_1}^{(0)} \\ \cdot & \cdot \\ \cdot & \cdot \\ \cdot & \cdot \end{bmatrix}$$

and $\overline{N}_{2\eta_0} = N_{2\eta_0} = 0$ which is the desired result (see Table 1).

Unfortunately, it seems that two different initilization procedures are required with the choice dependent on whether $S_1$ is zero. To make matters worse, the number of steps required for the initialization procedure varies. How do we combine an automate these procedures? Essentially, we need and automatic procedure for locating the first syndrome. Since the zero test is in the right column, we must start the syndromes there (we always check the top element of $z^{-1}R_2^{(i-1)}$. Thus, $$\begin{bmatrix} ? & - \\ S_1 & \\ \cdot & \\ \cdot & \\ S_{2t} & \end{bmatrix}$$

In order to determine the contents of the left column, suppose $S_1 \neq 0$. From above we know that after 1 step, the registers should contain, $$\begin{bmatrix} S_1 & x \\ S_2 & S_2 \\ \cdot & \cdot \\ S_{2t} & S_{2t} \\ -- & -- \end{bmatrix}$$

where x is a don't care. Also, $\overline{N}_1 = -1$. Let the left column initially contain $[\alpha_1 \ldots \alpha_{2t+1}]^T$. At the end of iteration 1 we will have, $$\begin{bmatrix} S_1 & 0 \\ S_2 & -\frac{S_1}{\alpha_1}\alpha_2 + S_2 \\ \cdot & \cdot \\ S_{2t} & -\frac{S_1}{\alpha_1}\alpha_{2t} + S_{2t} \\ & -- \end{bmatrix}$$

Hence, $\alpha_1 \neq 0$ and $\alpha_2 = \ldots = \alpha_{2t+1} = 0$. For convenience, let $\alpha_1 = 1$. Also, $\overline{N}_0 = 0$. This yields $\overline{N}_1 = -1$ since $S_1 \neq 0$.

Will this procedure work if $S_1 = 0$? Note that the algorithm will continue shifting $R_2$ up until a non-zero element appears at the top of the right-hand column. At the beginning of the $\eta_0^{th}$ iteration the registers will contain, $$\begin{bmatrix} 1 & 0 \\ 0 & S_{\eta_0} \\ \cdot & \cdot \\ \cdot & \cdot \\ \cdot & \cdot \end{bmatrix}$$

and $\overline{N}_{\eta_0} = -\eta_0$. The completion of the $\eta_0^{th}$ iteration yields, $$\begin{bmatrix} S_{\eta_0} & 0 \\ 0 & S_{\eta_0+1} \\ \cdot & \cdot \\ \cdot & \cdot \\ \cdot & \cdot \end{bmatrix}$$

and $\overline{N}_{\eta_0+1} = -\eta_0 + 1$. This is the proper initialization.

One point that we have yet to clarify is the initialization of $P_1$ and $P_2$! If $S_1 \neq 0$, then from (20) $P_1^{(1)}$ and $P_2^{(1)}$ should be, $$P_1^{(1)} = P_2^{(1)} = [0 \ 1 \ 0 \ldots 0]^T \qquad (22)$$

(The extra zero ([0 1 instead of [1 0) arises because the algorithm starts with $[0S_1 \ldots S_{2t}]^T$ in $R_2$. The extra zero is extraneous (really a place-holder).) (22) can be accomplished using our initialization procedure with, $$P_1^{(0)} = [0 \ldots 0]^T \qquad (23)$$

$$P_2^{(0)} = \underbrace{[1 \ 0 \ldots 0]^T}_{2t+1}$$

If $S_1 = 0$, then from (21)

$$P_1^{(\eta_0)} = P_2^{(\eta_0)} = [\underbrace{0 \ldots 0}_{\eta_0} 1 \ 0 \ldots 0]^T \qquad (24)$$

Once again, the initialization in (23) will achieve this.

We remark that the initialization procedure becomes more intuitive when the algorithm is derived in a polynomial setting, i.e. the same algorithm can be derived from Euclid's algorithm. There one initializes the algorithm with $z^{2t}$ and $S(z)$. Hence, $[1 \ 0 \ldots 0]^T = R_1^{(0)}$ is just the matrix equivalent of $z^{2t}$. This insight also tells us that the algorithm can also be used on Goppa codes when $R_1$ is initialized with the coefficients of the Goppa polynomial.

With the initialization specified the complete algorithm becomes, $$\begin{bmatrix} R_2^{(i)} \\ R_1^{(i)} \end{bmatrix} = \begin{bmatrix} z^{-1} & -\rho_i \\ z^{-1}\gamma_i(1-\gamma_i) & \end{bmatrix} \begin{bmatrix} R_2^{(i-1)} \\ R_1^{(i-1)} \end{bmatrix} \quad i = 1, \ldots, 2t \qquad (25)$$

$$\begin{bmatrix} P_2^{(i)} \\ P_1^{(i)} \end{bmatrix} = \begin{bmatrix} z & -\rho_i \\ z\gamma_i(1-\gamma_i) & \end{bmatrix} \begin{bmatrix} P_2^{(i-1)} \\ P_1^{(i-1)} \end{bmatrix}$$

$\rho_i = \underline{\text{top}}$ element $z^{-1}R_2^{(i-1)}$/top element $R_1^{(i-1)}$
$N_j = N_{j-1} + 1$ $$\overline{N}_j = \begin{cases} -N_j & N_j > 0, \rho_j \neq 0 \\ N_j & \text{otherwise} \end{cases}$$

$$\gamma_j = \begin{cases} 1 & N_j > 0, \rho_j \neq 0 \\ 0 & \text{otherwise} \end{cases}$$

$\overline{N}_0 = 0$ $R_2^{(0)} = [0 \ S_1 \ldots S_{2t}]^T \ R_1^{(0)} = [1 \ldots 0]^T$ $$P_2^{(0)} = [1 \ldots 0]^T \, P_1^{(0)} = [0 \ldots 0]^T$$

Conceptually the algorithm can be visualized as follows. At the $i^{th}$ iteration, the contents of $P_2$ are the tap gains for a feedback shift register which correctly generates the first i syndromes. Hence, after 2t iterations all the syndromes will have been matched. The new algorithm is a fast, extremely regular procedure for solving the Hankel matrix problem $Ax = b$ (see (7)) even when some of the minors are singular. If vector operation are performed in parallel, the algorithm requires time on the order of t, 0(t). The best previous algorithm required time 0(tlogt).

Note that the registers have length $2t+1$. This is because initially $R_2$ contains $[0 \, S_1 \ldots S_{2t}]^T$. The first step of the algorithm is a shift and hence the extra zero in $R_2$. This problem can be eliminated by doing this shift on the last step of each iteration instead of the first. Doing so shortens the registers to 2t.

$$\begin{bmatrix} R_2^{(i)} \\ R_1^{(i)} \end{bmatrix} = \begin{bmatrix} z^{-1} & -\rho_i \\ z^{-1}\gamma_i(1-\gamma_i) & \end{bmatrix} \begin{bmatrix} R_2^{(i-1)} \\ R_1^{(i-1)} \end{bmatrix} \quad (26)$$

$$= \begin{bmatrix} 1 & -\rho_i \\ \gamma_i(1-\gamma_i) & \end{bmatrix} \begin{bmatrix} z^{-1}R_2^{(i-1)} \\ R_1^{(i-1)} \end{bmatrix}$$

$$\begin{bmatrix} z^{-1}R_2^{(i)} \\ R_1^{(i)} \end{bmatrix} = \begin{bmatrix} z^{-1} & 0 \\ 0 & 1 \end{bmatrix} \begin{bmatrix} 1 & -\rho_i \\ \gamma_i(1-\gamma_i) & \end{bmatrix} \begin{bmatrix} z^{-1}R_2^{(i-1)} \\ R_1^{(i)} \end{bmatrix}$$

All other recursions have similar changes. The initial conditions become, $$z^{-1}R_2^{(0)} = [S_1 \ldots S_{2t}]^T \, R_1^{(0)} = [1 \ldots 0]^T$$

$$zP_2^{(0)} = [1 \ldots 0]^T \, P_1^{(0)} = [0 \ldots 0]^T$$

$$zP_2^{(2t)} = [\Lambda_{2t-1} \ldots \Lambda_1 \, 1]^T$$

ALGORITHM DERIVATION—APPLICATION TO THE KEY EQUATION

Recall that we obtained a matrix formulation of the key equation only after assuming that the solution order (# errors) was known. Can we apply the preceding matrix even when the solution order is unknown? Note that the solution to the key equation is the minimum length polynomial which generates the syndromes. With this in mind, recall the form of the P matrix provided by the new algorithm is, $$P = [p_0 z p_0 \ldots z^{\eta_0 - 1} p_0 \ldots p_{T-1} z p_{T-1} \ldots z^{\eta_{T-1} - 1} p_{T-1} p_T]$$

The length of $p_T$ (one plus the degree of the equivalent polynomial) is $$\sum_{k=0}^{T-1} \eta_k + 1 \quad (16)$$

Figure 14:
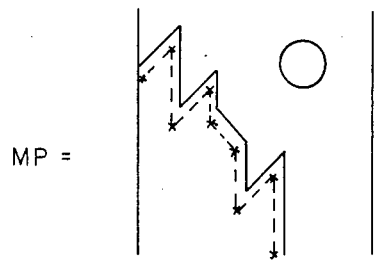
FIG. 14 illustrates the matrix for MP.

Corresponding to P, we have the lower triangular matrix Q as shown in FIG. 14. The vertical drops in Q correspond to points where free matches have been encountered. Lines with slope $-1$ result from shifting the present solution down. The important fact to garner from (27) is that Q is in echelon form. Since $$\sum_{k=0}^{T-1} \eta_k$$

columns are non-zero, Q is rank $$\sum_{k=0}^{T-1} \eta_k.$$

P is a matrix with ones on the diagonal. Thus, M must have rank $$\sum_{k=0}^{T-1} \eta_k.$$

We conclude that the minimal polynomial which generates M has length $$\sum_{k=0}^{T-1} \eta_k + 1.$$

Hence, $p_T$ is the desired solution. This fact demonstrates that the new algorithm does indeed provide a solution to the key equation. In the next section we will find that the new algorithm is extremely well suited for hardware implementation.

ALGORITHM DEVIATION—COMPUTING ω

Before examining possible hardware implementations, we need to consider two additions to the algorithm. The first of these additions concerns ω which is given a matrix definition in (6). To determine how to compute ω recursively, consider a new augmented matrix $\tilde{M}'$.

$$\tilde{M}' = \begin{bmatrix} & & & & S_1 \\ & \bigcirc & & S_1 & S_2 \\ & & \cdot & \cdot & \cdot \\ & & \cdot & \cdot & \cdot \\ & S_1 & \ldots & S_{2t-3} & S_{2t-2} \\ 0 & S_1 & S_2 & \ldots & S_{2t-2} & S_{2t-1} \end{bmatrix} \quad (28)$$

It is quite apparent that, $$\tilde{M}' P_2^{(2t)} = [\omega_1 \ldots \omega_{2t-1}]^T$$

where some of the $\omega_i$ may be zero. To compute ω recursively we define the following intermediate results, $$\tilde{M}' P_2^{(i)} = T_2^{(i)} \quad (29)$$

$$\tilde{M}' P_1^{(i)} = T_1^{(i)}$$

$$T_2^{(2t)} = [\omega_1 \ldots \omega_{2t-1}]^T$$

An update recursion is easily found, $$P_2^{(i)} = zP_2^{(i-1)} - \rho_i P_1^{(i-1)}$$

$$\tilde{M}' P_2^{(i)} = T_2^{(i)} = z^{-1}T_2^{(i-1)} - \rho_i T_1^{(i-1)}$$

$$T_1^{(i)} = z^{-1}T_2^{(i-1)}\gamma_i + (1-\gamma_i)T_1^{(i-1)}$$

Of course the real trick is to determine the initial conditions.

Suppose that $S_1 \neq 0$. From (20), $$P_2^{(2)} = [-S_2/S_1 \ 1 \ 0 \ldots 0]^T$$

$$P_1^{(2)} = [1 \ 0 \ldots 0]^T$$

$$T_2^{(2)} = [0 \ 0 \ldots S_1 \ 0]^T$$

$$T_1^{(2)} = [0 \ldots 0]^T$$

Using the same initialization procedure as described above we try, $$T_2^{(0)} = [0 \ldots 0|0]^T$$

$$T_1^{(0)} = [\underbrace{0 \ldots 0}_{2t} | -1]^T$$

$$T_2^{(1)} = [0 \ldots 0|S_1]^T$$

$$T_1^{(1)} = [0 \ldots 0|0]^T$$

$$T_2^{(2)} = [0 \ldots S_1|0]^T$$

$$T_1^{(2)} = [0 \ldots 0|0]^T$$

Note that the vectors now have length 2t.

Now let $S_1 = 0$. From (21), $$P_2^{(\eta_0+1)} = [\overbrace{0 \ldots 0}^{\eta_0-1} -S_{\eta_0+1}/S_{\eta_0} \ 1 \ 0 \ldots 0]^T$$

$$P_1^{(\eta_0+1)} = [\underbrace{0 \ldots 0}_{\eta_0-1} \ 1 \ 0 \ldots 0]^T$$

$$T_2^{(\eta_0+1)} = [0 \ 0 \ldots S_{\eta_0}]^T$$

$$T_1^{(\eta_0+1)} = [0 \ldots 0]^T$$

Since $S_1 = \ldots = S_{\eta_0 - 1} = 0$, $\omega_1 = \ldots = \omega_{\eta_0 - 1} = 0$. Let's try the same initialization.

$$T_2^{(0)} = [0 \ldots 0|0]^T$$

$$T_1^{(0)} = [0 \ldots 0|-1]^T$$

$$T_2^{(\eta_0)} = [0 \ldots 0|S_{\eta_0}]^T$$

$$T_1^{(\eta_0)} = [0 \ldots 0|0]^T$$

$$T_2^{(\eta_0+1)} = [0 \ldots S_{\eta_0}|0]^T$$

$$T_1^{(\eta_0+1)} = [0 \ldots 0|0]^T$$

Hence the recursions for $\omega$ are, $$\begin{bmatrix} z^{-1} T_2^{(i)} \\ T_1^{(i)} \end{bmatrix} = \begin{bmatrix} z^{-1} & 0 \\ 0 & 1 \end{bmatrix} \begin{bmatrix} 1 & -\rho_i \\ \gamma_i(1-\gamma_i) & \end{bmatrix} \begin{bmatrix} z^{-1} T_2^{(i-1)} \\ T_1^{(i-1)} \end{bmatrix} \quad (30)$$

$$z^{-1} T_2^{(0)} = [0 \ldots 0]^T \ T_1^{(0)} = [0 \ldots 0 - 1]^T$$

ALGORITHM DERIVATION—REDUCING THE NUMBER OF ITERATIONS

The present formulation of the algorithm requires 2t iterations for completion no matter how many errors are present; yet, it seems reasonable to expect some reduction if $e \leq t$ errors have occurred. In Peterson and Weldon (ERROR CORRECTING CODES, MIT Press, 1972—p. 284) it is shown that any set of 2e consecutive syndromes uniquely determine the error-locator polynomial, $\Lambda(z)$, when e errors are present. This is proven by demonstrating that the Hankel matrix formed from the first 2e syndromes has a non-singular e by e leading minor. Recall from the algorithm description that $p_e$ is the unique vector of P which is consistent with the first 2e syndromes (see (8)). (Since the first e by e minor is non-singular, $\nu_i = e$ for some value of i.) Note also that the contents of $P_2^{(2e)}$ are equal to $p_e$ (see Table 1).

For this information to be useful, we need some way of determining when only e errors are present. If $p_e = \Lambda$, then from the key equation, $$\Delta_j^{(2e)} = \sum_0^e p_e(i) S_{j-i} = 0 \ j = e+1, \ldots, 2t \quad (31)$$

where $p_e = [p_e(e) \ldots p_e(1) p_e(0)]^T$

If $p_e \neq \Lambda$, then some of the relationships in (31) will not be zero. From (17) and Table 1 we have, $$P_2^{(2e)} = z^{e-1} p_e$$

Hence, $$\widetilde{M} P_2^{(2e)} = [\Delta_{2e}^{(2e)} \ldots \Delta_{2t}^{(2e)} x \ldots x]^T$$

$$= R_2^{(2e)}$$

We conclude that if the top $2t - 2e + 1$ components of $R_2^{(2e)}$ are zero then $$P_2^{(2e)} = z^{e-1} \Lambda$$

Using this stopping condition the algorithm requires 2e iterations.

ARCHITECTURE

Before describing the architecture, it is important to understand the numerical quantities that we are dealing with. When a code has symbols in GF(q), the Galois field containing q elements, and blocklength $n = q^m - 1$, then it's syndromes can be represented by vectors of length $m = \log_q n$ over GF(q). If $q = p^r$ then additional representations are possible. Since $GF(p^{rm})$ and $GF(q^m)$ are isomorphic, the syndromes can be represented by vectors of length rm over GF(p). In particular, we remark that if $q = 2^r$ then the syndromes can be represented by binary vectors of length rm. Note that the specific representation that we choose depends on the degree of parallelism desired in the syndrome computations.

Addition and multiplication in a finite field are define by polynomial addition and multiplication modulo the polynomial which defines the extension field. Namely, if two syndromes are represented by $S_1 = A(z)$ and $S_2 = B(z)$ (polynomials formed from the vector representation), then $$S_1 + S_2 \rightarrow A(z) + B(z)$$

$$S_1 * S_2 \rightarrow A(z) B(z) \bmod g(z)$$

where g(z) generates the extension field.

Various multiplier architectures can be found in Peterson and Weldon. Others can be adapted from Kailath (LINEAR SYSTEMS, Prentice-Hall, 1980). We shall use the generic pipelined multiplier shown in FIG. 3a. All the registers have length log n (base depends on representation). FSR is a feedback shift register which multiples A by B modulo g(z). ↓ indicates a transfer of the entire register contents in one step. The number at the register corners indicate the times at which the 1$^{st}$ symbol appears at the right edge of the register. Note that with minor modifications the VLSI multiplies of Massey and Omura can used to construct the architectures derived below. Also, if pipelined multipliers are not required, some of the shift registers in the multiplier can be removed.

A FIRST TRY

A direct hardware implementation of the algorithm in (25) and (30) takes the form shown in FIG. 3b. The rectangular boxes represent storage elements. The top cell of $R_2$ has the ability to check if its contents are zero. Because of the way the algorithm was formulated, only the top cell need have this capability. Each iteration consists of two steps. First $p_i$ is computed and broadcast to all cells. Using $p_i$ the processing nodes perform the specified function. Then, $R_2$ and $T_2$ are shifted up one and $P_2$ down one. (Of course, P could be shifted up by simply turning its architecture upside down.) After 2t iterations, $\Lambda(z)$ will appear in $P_2$. The top element of $P_2$ will correspond to the leading coefficient (highest power of z) of $\Lambda$. This architecture requires $2(2t+2t+2t)$ storage elements.

STORAGE REDUCTION

Our objective is to combine R, P and T into two registers of length $3t+2$. The first step will be to combine R and P. As things are presently structured, $R_2$ always contains 2t elements; however, not all these values are indispensable. The values that we require are the ones that appear at the top of $R_2$ for each of the 2t iterations. These values are the pivots that tell us how to update P. Recall that the algorithm shifts $R_2$ up one at each iteration. Thus, at iteration i, the values below $2t-i$ will never make to the top of $R_2$. They are superfluous. As a consequence we need store only $2t-i$ values of $R_1$ and $2t-i$ values of $R_2$ at iteration i. It is also easy to see that at iteration i we need to store $i+1$ values of $P_1$ and $i+1$ values of $P_2$ ($P_2$ has length 1 at iteration 0). We conclude that only $2(2t+1)$ storage elements are required for R and P. The registers in R shrink and those in P lengthen.

Before combining R and P we need to modify the recursions for P so that it shifts up instead of down. This is done by simply flipping the initial condition.

$$\begin{bmatrix} z^{-1}P_2^{(i)} \\ P_1^{(i)} \end{bmatrix} = \begin{bmatrix} z^{-1} & 0 \\ 0 & 1 \end{bmatrix} \begin{bmatrix} 1 & -\rho_i \\ \gamma_i(1-\gamma_i) & \end{bmatrix} \begin{bmatrix} z^{-1}P_2^{(i-1)} \\ P_1^{(i-1)} \end{bmatrix}$$

$$z^{-1}P_2^{(0)} = [0 \ldots 0\ 1]^T\ P_1^{(0)} = [0 \ldots 0]^T$$

Let us call the registers containing both R and P, $\overline{R}_1$ and $\overline{R}_2$. The modified recursions are, $$\begin{bmatrix} z^{-1}\overline{R}_2^{(i)} \\ \overline{R}_1^{(i)} \end{bmatrix} = \begin{bmatrix} z^{-1} & 0 \\ 0 & 1 \end{bmatrix} \begin{bmatrix} 1 & -\rho_i \\ \gamma_i(1-\gamma_i) & \end{bmatrix} \begin{bmatrix} z^{-1}\overline{R}_2^{(i-1)} \\ \overline{R}_1^{(i-1)} \end{bmatrix}$$

$$\overline{R}_1^{(i)}(2t+1-i) = 0\ i \geq 1$$

$$z^{-1}\overline{R}_2^{(0)} = [S_1 \ldots S_{2t}|1]^T\ \overline{R}_1^{(0)} = [1\ 0 \ldots 0|0]^T$$

Here $\overline{R}_1^{(i)}(m)$ indicates that the m$^{th}$ element of $\overline{R}_1^{(i)}$. The purpose of this statement is to clear the lower part of the register for use by P (corresponds to the shifting dotted line in the linear recurrence example). The algorithm shown here is exactly the one used in FIG. 2.

Now we will combine R, P and T. Note that the maximum number of errors the code can correct is t. This means that if $\Lambda$ is longer than $t+1$, more than t errors have occurred. Because of this, we need store only the first $t+1$ elements of $\Lambda$. Even so, we can still detect a decoding failure. If $N_{2t}$ is negative then $\Lambda$ would have been longer than $t+1$ (even though that is all we are storing). This follows from Table 1. If $\Lambda$ is longer than $t+1$ it can't be uniquely determined since only 2t syndromes are known. A non-unique $\Lambda$ is indicated by a negative $N_{2t}$. The combined recursions are, $$\begin{bmatrix} z^{-1}\overline{R}_2^{(i)} \\ \overline{R}_1^{(i)} \end{bmatrix} = \begin{bmatrix} z^{-1} & 0 \\ 0 & 1 \end{bmatrix} \begin{bmatrix} 1 & -\rho_i \\ \gamma_i(1-\gamma_i) & \end{bmatrix} \begin{bmatrix} z^{-1}\overline{R}_2^{(i-1)} \\ \overline{R}_1^{(i-1)} \end{bmatrix} \quad (32)$$

$$\overline{R}_1^{(i)}(2t+1-i) = 0\ i \geq 1$$

$$\overline{R}_1^{(i)}(3t+2-i) = 0$$

$$z^{-1}\overline{R}_2^{(0)} = [S_1 \ldots S_{2t}|\underbrace{10 \ldots 0}_{t+1}|0]^T\ \overline{R}_1^{(0)} = [10 \ldots 0|0 \ldots 0|-1]^T$$

$$z^{-1}\overline{R}_2^{(2t)} = [\Lambda_0\ \Lambda_1 \ldots \Lambda_t|\omega_1 \ldots \omega_{2t}\ x]^T,\ x = \text{don't care}$$

where x is a don't care. The new architecture is shown in FIG. 4.

ELIMINATION OF DIVISION AND CONTROL MODIFICATION

Two last changes greatly improve the performance of the architecture. The first change involves the removal of the division from the algorithm. As we shall see in the cell implementations, this greatly increases throughput. Let $a_i$ = top element $\overline{R}_1^{(i-1)}$ $b_i$ = top element $z^{-1}\overline{R}_2^{(i-1)}$ Using this notation, we re-write the recursions.

$$\begin{bmatrix} z^{-1}\overline{R}_2^{(i)} \\ \overline{R}_1^{(i)} \end{bmatrix} = \begin{bmatrix} z^{-1} & 0 \\ 0 & 1 \end{bmatrix} \begin{bmatrix} a_i & -b_i \\ \gamma_i(1-\gamma_i) & \end{bmatrix} \begin{bmatrix} z^{-1}\overline{R}_2^{(i-1)} \\ \overline{R}_1^{(i-1)} \end{bmatrix} \quad (33)$$

How does this affect the algorithm? Let $\overline{R}'_1$ and $\overline{R}'_2$ be the registers in the original version of the algorithm. Suppose that some point we have, $\overline{R}_2^{(i)} = c_2\overline{R}'_2^{(i)},\ \overline{R}_1^{(i)} = c_1\overline{R}'_1^{(i)}$ Let $a'_{i+1}$ be the top element of $\overline{R}'_1^{(i)}$ and $b'_{i+1}$ be the top element of $\overline{R}'_2^{(i)}$. Then, $$\overline{R}_2^{(i+1)} = a_{i+1}z^{-1}\overline{R}_2^{(i)} - b_{i+1}\overline{R}_1^{(i)}$$

$$a_{i+1} = c_1a'_{i+1}, \; b_{i+1} = c_2b'_{i+1}$$

$$\overline{R}_2^{(i+1)} = c_1a'_{i+1}c_2z^{-1}\overline{R}_2'^{(i)} - c_2b'_{i+1}c_1\overline{R}_1'^{(i)}$$

$$= c_1c_2a'_{i+1}\overline{R}_2'^{(i+1)}$$

Can $c_1$ or $c_2$ ever be zero? No, since we always pull $a_i$ out of the division and $a_i \neq 0$. Therefore, $$\overline{R}_2^{(2t)} = c\overline{R}'_2{}^{(2t)} \; c \neq 0$$

Thus we recover $c\Lambda(z)$ and $c\omega(z)$; but, since we only need the roots of $\Lambda(z)$ and the ratio, $\omega(z)/\Lambda'(z)$, the constant is unimportant.

The final algorithm modification deals with the control variables. At the moment we have to test the condition, $$N_i > 0 \text{ and } \rho_i \neq 0$$

However, testing for $N_i > 0$ is not convenient for hardware implementation. Suppose that instead we had a flag which indicated when $N_i$ was non-negative.

| $\overline{z}_i N_{i-1} = 0 \;(1 = \text{yes})$ | $\overline{z}_i$ |
|---|---|
| 0  0 | 0 |
| 0  1 | 1 |
| 1  0 | 1 |
| 1  1 | 1 |

We set $\gamma_i$ and set $\overline{N}_i$ negative if $\overline{z}_i$ is 1 and the top element of $R_2$ is not zero.

| $\overline{z}_i$ top $R_2 = 0 \;(1 = \text{yes})$ | $\gamma_i$ |
|---|---|
| 0  0 | 0 |
| 0  1 | 0 |
| 1  0 | 0 |
| 1  1 | 1 |

If $\gamma_i$ is set to one, then $\overline{z}$ must be reset.

| $\overline{z}_i \gamma_i$ | $\overline{z}_i$ |
|---|---|
| 0  0 | 0 |
| 0  1 | 1 (really not possible) |
| 1  0 | 1 |
| 1  1 | 0 (reset) |

$\overline{N}_i$ is set negative if $\gamma_i = 1$. By changing the way the zero test words, the number of gates reqired to implement this logic can be optimized.

The new version of the architecture is displayed in FIG. 5. Note that it is a systolic array and hence simple to implement. This conclusion is further strengthened by examining the implementations of the cells in FIG. 5. The computing array of FIG. 5 has two types of cells. The top cell on each column is special because it computes control and pivot information. The remaining cells, all of the same form, use this information to perform an update. A possible top cell implementation is shown in FIG. 6. The top two lines compute control information for $\gamma_i$. A slightly modified version of the previously described control was used. $\overline{N}$ is an integer which is transmitted serially. The 0? box checks if $\overline{N}$ is zero (1 is yes). The shift cell is a length log n shift register. The comp cell performs a complement operation (the exact way a negative number is formed depends on the number system being used). The bottom two lines are the top elements of $R_1$ and $R_2$. These values are shifted and then stored and transmitted down to the rest of the cells. After the iteration is complete, the values are be exchanged according $\gamma_i$.

The rest of the processing blocks have the form shown in FIG. 7. The cell implements the operation given in (32). The top line is for an element of $R_1$ and the bottom for $R_2$. Shift registers "store" the output of the previous multiplications. Note that each multiplier picks up the appropriate set of log n lines from the bus The XCH box exchanges $R_1$ and $R_2$ according to $\gamma_i$. Note that the elements of $R_2$ are shifted up automatically. We note that if the broadcasting of the pivot becomes a problem, some extra stages can be added to the left-hand shift registers to allow more leeway. A more robust solution to this problem will be discussed later.

COMPARISON WITH BERLEKAMP-MASSEY

At this point it is instructive to compare this architecture with the best previous solution. One candidate for this accolade is a parallel architecture for implementing the Berlekamp-Massey algorithm which was suggested by Massey (see FIG. 8). The Massey architecture can be thought of in two pieces. The upper half of the architecture is used to update $\Lambda$, the error-locator polynomial. $\Delta$ is essentially a prediction error—a check whether any "free matches" have occurred. B is some previous value of $\Lambda$. Except for broadcasting $\Delta$, all communication is local. The lower half is a different story. This section computes $\Delta$ from an inner product of $\Lambda$ and some segment of the syndromes. Note the possibly long wires. More importantly, the inner product requires a t-input adder. Since a typical adder has only a few inputs, this t-component addition requires time log t. Additionally, the next iteration can't begin until the inner product is completed. This prevents efficient pipelining of the architecture. In the form shown, the Massey architecture requires 2t log 2t iterations to find the solution to the key equation.

The major difference between the Massey architecture and the algorithm we propose is that removal of the inner product operation. This leads to a simplification that is apparent from comparing FIGS. 5 and 8. Except for broadcasting pivot information, the new architecture requires only local communication between processing elements. This helps increase processing speed. In fact, even the pivot information can be pipelined making communication completely local (we omit the details for now). Because of the inner product operation, the Massey architecture can't achieve this. We remark that the new algorithm requires time min(2t,2e) as opposed to 2t log 2t which is required by the Massey architecture.

PIPELINING

Another advantage of the new architecture is the ease with which it can be pipelined. The idea behind pipelining is the following. At each iteration in the new architecture, the various processing elements fetch information from the storage elements and then compute some function. The new results are put back in essentially the same storage elements once the computation is complete. Suppose, however, that we had another copy of the architecture lying next to the original. Then instead of placing the results in the old storage elements we could place them in the new circuit. This leaves the original circuit ready to accept a new problem. Taking this idea to the limit, assume that we had as many circuits as iterations, i.e. 2t. The overall architecture would then be able to accept a new set syndromes (a new codeword) after each iteration. Using a single architecture, one must wait 2t iterations before a new set of syndromes can be entered. The effect of this pipelining or replication is to increase throughput. Because of the inner product operation, this is not easy to do with the Massey architecture.

An example of a fully pipelined array is shown in FIG. 9. Here t is taken to be 2. We remark that FIG. 9 has the structure of a systolic array and hence is extremely easy to construct. Each column corresponds to the architecture depicted in FIG. 5. The diagonal connections between cells perform the shifting of $\overline{R}_2$. The architecture can be considered as three pieces: an upper triangular part, a middle strip and a lower triangular part. While the upper triangle works on the syndromes and generates the pivots, the middle strip updates the estimate of $\Lambda$. The lower triangle updates the estimate of $\omega$. The outputs of the last stage given the error-locator and evaluator polynomials as shown in FIG. 9. The pipeline period of the array (time between successive syndromes) is the time required to perform one iteration. We remark that there are other ways to pipeline the array. Instead of performing one iteration, each column of processors could perform m iterations. Then only 2t/m columns would be required and the pipeline period would be m iterations. Depending on the hardware before and after the key equation solver, a particular degree of pipelining might be advantageous.

We note that slightly modified cells are used to implement the pipelined array. These are shown in FIG. 10.

PIPELINING AT THE ITERATION LEVEL—LOCAL COMMUNICATION

Consider once again the architecture in FIG. 6. One possibly significant drawback is that it requires us to broadcast the pivot information ($a_i$ and $b_i$) to all the computation cells. Essentially we require the broadcast to be completed in one shift register clock cycle. For large values of t this would require driving a long wire with associated area and time delay penalties; hence, a large and slower architecture. A more ideal situation would result if we were only required to send pivot information to adjacent cells.

To show how the architecture can be appropriately modified, we introduce the following notation, $$[\overline{R}_1^{(t)}\ \overline{R}_2^{(t)}] = \begin{bmatrix} r_{11}^{(t)} & r_{21}^{(t)} \\ r_{1,2t+1}^{(t)} & r_{2,2t+1}^{(t)} \end{bmatrix} \rightarrow \begin{bmatrix} i\ i \\ i\ i \end{bmatrix}$$

Thus, $$\begin{bmatrix} i\ i \\ j\ j \\ j\ j \end{bmatrix} \rightarrow \begin{bmatrix} r_{11}^{(t)} & r_{21}^{(t)} \\ r_{12}^{(t)} & r_{22}^{(t)} \\ r_{1,2t+1}^{(t)} & r_{2,2t+1}^{(t)} \end{bmatrix}$$

Let t=2, What would happen if $a_i$ and $b_i$ were only allowed to propagate down one level at each iteration? (we ignore $\omega$ for now)

TABLE 2

| 0 0 | 1 1 | 1 1 | 2 2 | 2 2 | 3 3 |
|---|---|---|---|---|---|
| 0↓¹0 | 1 — | 1↓²1 | 2 — | 2↓³2 | 3 — |
| 0 0 | 0↓¹0 | 1 — | 1↓²1 | 2 — | 2↓³3 |
| 0 0 | 0 0 | 0↓¹0 | 1 — | 1↓²1 | 2 — |
| 0 0 | 0 0 | 0 0 | 0↓¹0 | 1 1 | 1↓²1 |
| Stop # →0 | 1 | 2 | 3 | 4 | 5 |

| 3 3 | 4 4 | 4 4 | 4 4 | 4 4 |
|---|---|---|---|---|
| 3↓⁴3 | 4 — | 4 4 | 4 4 | 4 4 |
| 3 — | 3↓⁴3 | 4 — | 4 4 | 4 4 |
| 2↓³2 | 3 — | 3↓⁴3 | 4 4 | 4 4 |
| 2 2 | 2↓³2 | 3 3 | 3↓⁴3 | 4 4 |
| 6 | 7 | 8 | 9 | 10 |

In Table 2, the notation $j\downarrow^k j$ indicates that pivots corresponding to iteration k are now available for updating the registers. We observe from the table that each one of the iterations from the algorithm is spread out in time. Each $\downarrow^k$ can be thought of as a computational wavefront which is propagating the associated iteration. Note that we can't begin the second wavefront until step 2 (recall that $r_{22}^{(1)}$ is computed from $r_{13}^{(0)}$ and $r_{23}^{(0)}$). As a result, the separation between wavefronts is 2 steps. From the table we can deduce that $6t-2$ steps are required to complete the algorithm when only local communication is allowed.

This seems like a rather drastic penalty! We can trace the separation of the wavefronts back to the fact that we don't begin computing $r_{22}^{(1)}$ until step 1; yet, this means that we are allotting a full step for the pivots to propagate down from level 2 to level 3. A more realistic assumption is that this propagation takes only a new shift register clock cycles. Using this assumption the computation of $r_{22}^{(1)}$ can begin while $r_{21}^{(1)}$ is still being completed. Of course, doing this blurs the separation between the steps in Table 2. If we call the time for propagation $\Delta$, then the time between wavefronts becomes $1+\Delta$ where $\Delta$ is fractional. The total time required to compute $\overline{R}_2^{(2t)}$ becomes, $$1+(2t-1)(1+\Delta)+(2t-1)\Delta$$

The first wavefront takes one step to initiate while the remaining wavefronts are separated by $1+\Delta$. Completing the tail (see FIG. 11) takes time $(2t-1)\Delta$ since there are $2t-1$ elements of $\overline{R}_2^{(2t)}$ left to compute. The total time is $$(2t-1)(1+2\Delta)+1$$

As long as $\Delta$ is small, the expense associated with local communication is not too high.

The effective computation time can be reduced even further by making the following observation: we can begin computation with the next set of syndromes before completing the tail of the computations involving the previous set. To see this, consider FIG. 11. In Table 2, all the data was sitting in the processors at time 0; yet, we could only process the first and second syndromes. The third syndrome was not required until time $\Delta$, and the fourth at $2\Delta$. Thus, we could enter the data staggered in time as shown in FIG. 11. We also note that the first and second processors have finished their required computations at time $1+(2t-1)(1+\Delta)$ They are ready to accept new syndromes. These facts suggest the pipelining scheme shown in FIG. 11. The time between successive sets of syndromes is, $$1+(2t-1)(1+\Delta) \quad (33)$$

Figure 12:
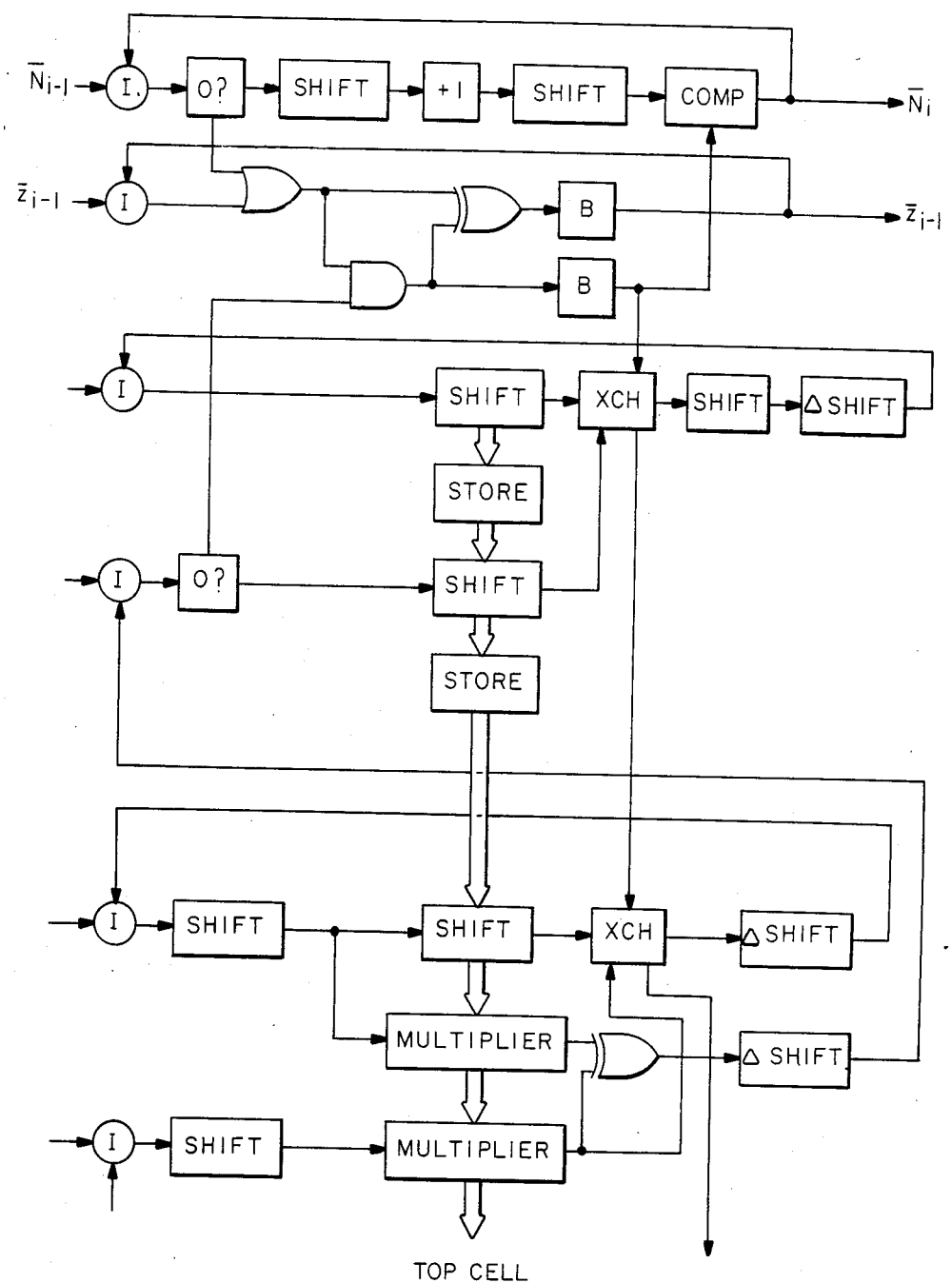
FIG. 12 is a schematic of a combined cell structure for implementing the algorithm in accordance with the invention.
Figure 13:
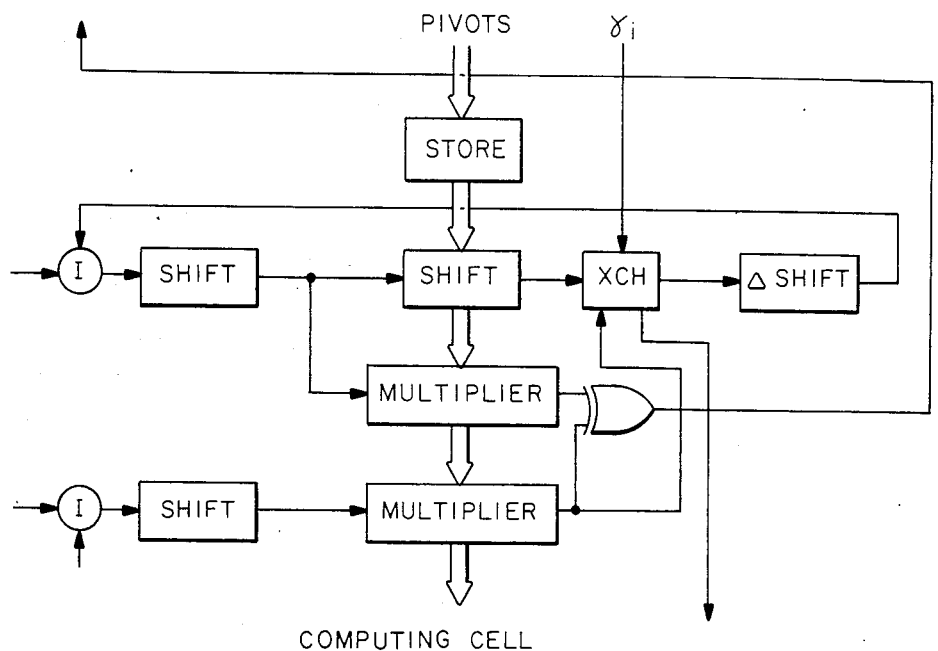
FIG. 13 is a schematic of a bottom cell in the array of FIG. 9.

To implement the algorithm with local communication, new cell descriptions are required. The top two cells become one and are shown in FIG. 12. The $\Delta$ shift register has length $\Delta$. The difference between these cells and the ones they replace becomes apparent when examining the bottom cells (see FIG. 13). Note the additional storage unit on the pivot lines. This gates the pivot information and determines the propagation. Additional shift register are present on some output lines to align data. As done previously, we can also replicate the architecture in space to increase throughput. An example of this is shown in FIG. 14.

ACHIEVABLE THROUGHPUT

Using these cell implementations of FIG. 10 it is possible to estimate the processing speed of the new architecture. Suppose that we use a fully pipelined array, i.e. 2t columns. Thus, the pipeline period is one iteration. Since the multipliers require log n shift cycles, the time per iteration is approximately log n shift cycles (the multipliers are pipelined). Consider a numerical example. Let the desired bit rate be 500 Mb/s. How fast must the shift registers be clocked in order to support this data rate? Assume the blocklength is 127. The time between codewords is n/500. Let $T_\phi$ be the shift register clock period. Thus, $$\frac{1}{T_\phi} = \frac{500 * \log n}{n} \quad (23)$$

$$= 27.5 \text{ MHz}$$

This clock rate seems very reasonable. Hence, pipelining can make high data rates achievable.

While the invention has been described with reference to specific embodiments, the description is illustrative of the invention and is not to be construed as limiting the invention. Various mdifications and applications may occur to those skilled in the art without departing from the true spirit and scope of the invention as defined by the appended claims.

What is claimed is:

1. A method of identifying and correcting errors in coded data comprising the steps of
   computing syndromes (s) from said coded data,
   computing error location and error evaluator polynomials from said syndrome using the algorithm:

ALGORITHM SUMMARY $$\begin{bmatrix} z^{-1}R_2^{(i)} \\ R_1^{(i)} \end{bmatrix} = \begin{bmatrix} z^{-1} & 0 \\ 0 & 1 \end{bmatrix} \begin{bmatrix} 1 & -\rho_i \\ \gamma_i(1-\gamma_i) \end{bmatrix} \begin{bmatrix} z^{-1}R_2^{(i-1)} \\ R_1^{(i-1)} \end{bmatrix}$$

$$\begin{bmatrix} -^{-1}P_2^{(i)} \\ P_1^{(i)} \end{bmatrix} = \begin{bmatrix} z^{-1} & 0 \\ -0 & 1 \end{bmatrix} \begin{bmatrix} 1 & -\rho_i \\ \gamma_i(1-\gamma_i) \end{bmatrix} \begin{bmatrix} z^{-1}P_2^{(i-1)} \\ P_1^{(i-1)} \end{bmatrix}$$

$$\begin{bmatrix} z^{-1}T_2^{(i)} \\ T_1^{(i)} \end{bmatrix} = \begin{bmatrix} z^{-1} & 0 \\ 0 & 1 \end{bmatrix} \begin{bmatrix} 1 & -\rho_i \\ \gamma_i(1-\gamma_i) \end{bmatrix} \begin{bmatrix} z^{-1}T_2^{(i-1)} \\ T_1^{(i-1)} \end{bmatrix}$$

-continued
ALGORITHM SUMMARY where
$\rho_i$ = top element $z^{-1}R_2^{(i-1)}$/top element $R_1^{(i-1)}$
$N_i = \overline{N}_{i-1} + 1$ $$\tilde{N}_i = \begin{cases} -N_i & N_i > 0, \rho i = 0 \\ N_i & \text{otherwise} \end{cases}$$

$$\gamma_i = \begin{cases} 1 & N_i > 0, \rho i = 0 \\ 0 & \text{otherwise} \end{cases}$$

$\overline{N}_o = 0$
$z^{-1}R_2^{(0)} = [S_1 \ldots S_{2t}]^T \ R_1^{(0)} = [1 \ldots 0]^T$
$z^{-1}P_2^{(0)} = [0 \ldots 0\ 1]^T P_1^{(0)} = [0 \ldots 0]^T$
$z^{-1}T_2^{(0)} = [0 \ldots 0]^T T_1^{(0)} = [0 \ldots 0-1]^T$
$z^{-1}P_2^{(2t)} = [1\Lambda_o \ldots \Lambda_{2t-1}]^T$
$z^{-1}T_2^{(2t)} = [\omega_1 \ldots \omega_{2t}]^T$ computing error locations and magnitudes based on the roots of said polynomials, and
correcting the errors based on the computed error locations and magnitudes.

2. A processor for computing error location and error evaluator polynomials based on syndromes computed from coded data comprising
   a plurality of control cells for computing control signals, $\gamma_i$, and passing the control signal and data to computer cells,
   a plurality of computation cells for performing recursive operations on said data, said plurality of control cells and said plurality of computation cells being organized as a pipelined systolic array of processing cells (FIG. 9) in accordance with the following algorithm:

$$\begin{bmatrix} z^{-1}R_2^{(i)} \\ R_1^{(i)} \end{bmatrix} = \begin{bmatrix} z^{-1} & 0 \\ 0 & 1 \end{bmatrix} \begin{bmatrix} 1 & -\rho_i \\ \gamma_i(1-\gamma_i) \end{bmatrix} \begin{bmatrix} z^{-1}R_2^{(i-1)} \\ R_1^{(i-1)} \end{bmatrix}$$

$$\begin{bmatrix} z^{-1}P_2^{(i)} \\ P_1^{(i)} \end{bmatrix} = \begin{bmatrix} z^{-1} & 0 \\ 0 & 1 \end{bmatrix} \begin{bmatrix} 1 & -\rho_i \\ \gamma_i(1-\gamma_i) \end{bmatrix} \begin{bmatrix} z^{-1}P_2^{(i-1)} \\ P_1^{(i-1)} \end{bmatrix}$$

$$\begin{bmatrix} z^{-1}T_2^{(i)} \\ T_1^{(i)} \end{bmatrix} = \begin{bmatrix} z^{-1} & 0 \\ 0 & 1 \end{bmatrix} \begin{bmatrix} 1 & -\rho_i \\ \gamma_i(1-\gamma_i) \end{bmatrix} \begin{bmatrix} z^{-1}T_2^{(i-1)} \\ T_1^{(i-1)} \end{bmatrix}$$

where
$\rho_i$ = top element $z^{-1}R_2^{(i-1)}$/top element $R_1^{(i-1)}$ $N_i = \overline{N}_{i-1} + 1$ $$\overline{N}_i = \begin{cases} -N_i & N_i > 0, \rho i = 0 \\ N_i & \text{otherwise} \end{cases}$$

$$\gamma_i = \begin{cases} 1 & N_1 > 0, \rho i = 0 \\ 0 & \text{otherwise} \end{cases}$$

$\overline{N}_o = 0$ $z^{-1}R_2^{(0)} = [S_1 \ldots S_{2t}]^T R_1^{(0)} = [1 \ldots 0]^T$ -continued $$z^{-1}P_2^{(0)} = [0 \ldots 0\ 1]^T\ P_1^{(0)} = [0 \ldots 0]^T$$

$$z^{-1}T_2^{(0)} = [0 \ldots 0]^T\ T_1^{(0)} = [0 \ldots 0 - 1]^T$$

$$z^{-1}P_2^{(2t)} = [1\Lambda_o \ldots \Lambda_{2t-1}]^T$$

$$z^{-1}T_2^{(2t)} = [\omega_1 \ldots \omega_{2t}]^T.$$

3. A method of identifying and correcting errors in coded data comprising the steps of
(1) computing syndromes (s) from said coded data,
(2) computing error location and error evaluator polynomials from said syndrome using the algorithm:

ALGORITHM SUMMARY $$\begin{bmatrix} z^{-1}R_2^{(i)} \\ R_1^{(i)} \end{bmatrix} = \begin{bmatrix} z^{-1} & 0 \\ 0 & 1 \end{bmatrix} \begin{bmatrix} b_i\ a_i \\ \gamma_i(1 - \gamma_i) \end{bmatrix} \begin{bmatrix} z^{-1}R_2^{(i-1)} \\ R_1^{(i-1)} \end{bmatrix}$$

$$\begin{bmatrix} z^{-1}P_2^{(i)} \\ P_1^{(i)} \end{bmatrix} = \begin{bmatrix} z^{-1} & 0 \\ 0 & 1 \end{bmatrix} \begin{bmatrix} b_i\ a_i \\ \gamma_i(1 - \gamma_i) \end{bmatrix} \begin{bmatrix} z^{-1}P_2^{(i-1)} \\ P_1^{(i-1)} \end{bmatrix}$$

$$\begin{bmatrix} z^{-1}T_2^{(i)} \\ T_1^{(i)} \end{bmatrix} = \begin{bmatrix} z^{-1} & 0 \\ 0 & 1 \end{bmatrix} \begin{bmatrix} b_i\ a_i \\ \gamma_i(1 - \gamma_i) \end{bmatrix} \begin{bmatrix} z^{-1}T_2^{(i-1)} \\ T_1^{(i-1)} \end{bmatrix}$$

where
$R_i, P_i, T_i$ are column vectors of length $2t$
$t$ is the number of errors that can be detected
$a_i$ = top element $z^{-1}R_2^{(i-1)}$
$b_i$ = top element $R_1^{(i-1)}$
$N_i = \overline{N}_{i-1} + 1$ $$N_i = \begin{cases} -N_i\ N_i > 0, \rho i = 0 \\ N_i\ \text{otherwise} \end{cases}$$

$$\gamma_i = \begin{cases} 1\ N_1 > 0, \rho i = 0 \\ 0\ \text{otherwise} \end{cases}$$

$\overline{N}_o = 0$
$z^{-1}R_2^{(0)} = [S_1 \ldots S_{2t}]^T\ R_1^{(0)} = [1 \ldots 0]^T$
$z^{-1}P_2^{(0)} = [0 \ldots 0\ 1]^T\ P_1^{(0)} = [0 \ldots 0]^T$
$z^{-1}T_2^{(0)} = [0 \ldots 0]^T\ T_1^{(0)} = [0 \ldots 0 - 1]^T$
$z^{-1}P_2^{(2t)} = c[1\Lambda_o \ldots \Lambda_{2t-1}]^T$ -continued
ALGORITHM SUMMARY $$z^{-1}T_2^{(2t)} = c[\omega_1 \ldots \omega_{2t}]^T$$

computing error locations and magnitudes based on the roots of said polynomials, and
correcting the errors based on the computed error locations and magnitudes.

4. A processor for computing error location and error evaluator polynomials based on syndromes computed from coded data comprising
a plurality of control cells (FIGS. 6, 12) for computing control signals, $\gamma_i$, and passing the control signal and data to computation cells,
a plurality of computation cells (FIGS. 7, 13) for performing recursive operations on said data,
said plurality of control cells and said plurality of computation cells being organized as a pipelined systolic array of processing cells in accordance with the following algorithm:

$$\begin{bmatrix} z^{-1}R_2^{(i)} \\ R_1^{(i)} \end{bmatrix} = \begin{bmatrix} z^{-1} & 0 \\ 0 & 1 \end{bmatrix} \begin{bmatrix} b_i - a_i \\ \gamma_i(1 - \gamma_i) \end{bmatrix} \begin{bmatrix} z^{-1}R_2^{(i-1)} \\ R_1^{(i-1)} \end{bmatrix}$$

$$\begin{bmatrix} z^{-1}P_2^{(i)} \\ P_1^{(i)} \end{bmatrix} = \begin{bmatrix} z^{-1} & 0 \\ 0 & 1 \end{bmatrix} \begin{bmatrix} b_i - a_i \\ \gamma_i(1 - \gamma_i) \end{bmatrix} \begin{bmatrix} z^{-1}P_2^{(i-1)} \\ P_1^{(i-1)} \end{bmatrix}$$

$$\begin{bmatrix} z^{-1}T_2^{(i)} \\ T_1^{(i)} \end{bmatrix} = \begin{bmatrix} z^{-1} & 0 \\ 0 & 1 \end{bmatrix} \begin{bmatrix} b_i - a_i \\ \gamma_i(1 - \gamma_i) \end{bmatrix} \begin{bmatrix} z^{-1}T_2^{(i-1)} \\ T_1^{(i-1)} \end{bmatrix}$$

where
$R_i, P_i, T_i$ are column vectors of length $2t$
$t$ is the number of errors that can be detected
$a_i$ = top element $z^{-1}R_2^{(i-1)}$
$b_i$ = top element $R_1^{(i-1)}$
$N_i = \overline{N}_{i-1} + 1$ $$N_i = \begin{cases} -N_i\ N_i > 0, \rho i = 0 \\ N_i\ \text{otherwise} \end{cases}$$

$$\gamma_i = \begin{cases} 1\ N_1 > 0, \rho i = 0 \\ 0\ \text{otherwise} \end{cases}$$

$\overline{N}_o = 0$
$z^{-1}R_2^{(0)} = [S_1 \ldots S_{2t}]^T\ R_1^{(0)} = [1 \ldots 0]^T$
$z^{-1}P_2^{(0)} = [0 \ldots 0\ 1]^T\ P_1^{(0)} = [0 \ldots 0]^T$
$z^{-1}T_2^{(0)} = [0 \ldots 0]^T\ T_1^{(0)} = [0 \ldots 0 - 1]^T$
$z^{-1}P_2^{(2t)} = [1\Lambda_o \ldots \Lambda_{2t-1}]^T$
$z^{-1}T_2^{(2t)} = [\omega_1 \ldots \omega_{2t}]^T.$

* * * * *